(12) United States Patent
Kawamura et al.

(10) Patent No.: US 8,633,491 B2
(45) Date of Patent: Jan. 21, 2014

(54) DISPLAY DEVICE AND MANUFACTURING METHOD THEREOF

(75) Inventors: Tetsuya Kawamura, Himeji (JP); Masashi Sato, Mobara (JP); Yoshiki Watanabe, Otaki (JP); Hiroaki Iwato, Mobara (JP); Masafumi Hirata, Oamishirasato (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 497 days.

(21) Appl. No.: 12/805,851

(22) Filed: Aug. 20, 2010

(65) Prior Publication Data
US 2011/0042675 A1    Feb. 24, 2011

(30) Foreign Application Priority Data

Aug. 20, 2009  (JP) .................. 2009-191313
Aug. 20, 2009  (JP) .................. 2009-191316

(51) Int. Cl.
*H01L 29/786*  (2006.01)
*H01L 21/8232*  (2006.01)

(52) U.S. Cl.
USPC ............. 257/72; 257/E21.411; 257/E29.273; 438/151

(58) Field of Classification Search
USPC .................... 257/72, 21.411, 29.73; 438/151
See application file for complete search history.

(56) References Cited

U.S. PATENT DOCUMENTS

2005/0092998 A1 * 5/2005 Yamazaki et al. .............. 257/72
2005/0170565 A1 * 8/2005 Fujii et al. ..................... 438/149
2005/0208710 A1 * 9/2005 Isobe et al. .................... 438/149

FOREIGN PATENT DOCUMENTS

JP    9-138418    5/1997
JP    10-20288    1/1998

\* cited by examiner

*Primary Examiner* — Steven J Fulk
(74) *Attorney, Agent, or Firm* — Antonelli, Terry, Stout & Kraus, LLP.

(57) ABSTRACT

An etching resist including first and second portions, the first portion being thicker than the second portion, is formed on a metallic layer. Through the etching resist, a semiconductor layer and the metallic layer are patterned by etching so as to form a wiring from the metallic layer and leave the semiconductor layer under the wiring. An electrical test is conducted on the wiring. The second portion is removed while the first portion is left unremoved. Selective etching is performed through the first portion so as to leave the semiconductor layer unetched to pattern the wiring to be divided into drain and source electrodes. A substrate is cut. In patterning the wiring, the wiring is etched to be cut at a position closer to a cutting line of the substrate with respect to the drain and source electrodes, while leaving the semiconductor layer unetched.

5 Claims, 39 Drawing Sheets

36 22 32 34 14 12   14 32 34 10 12 30

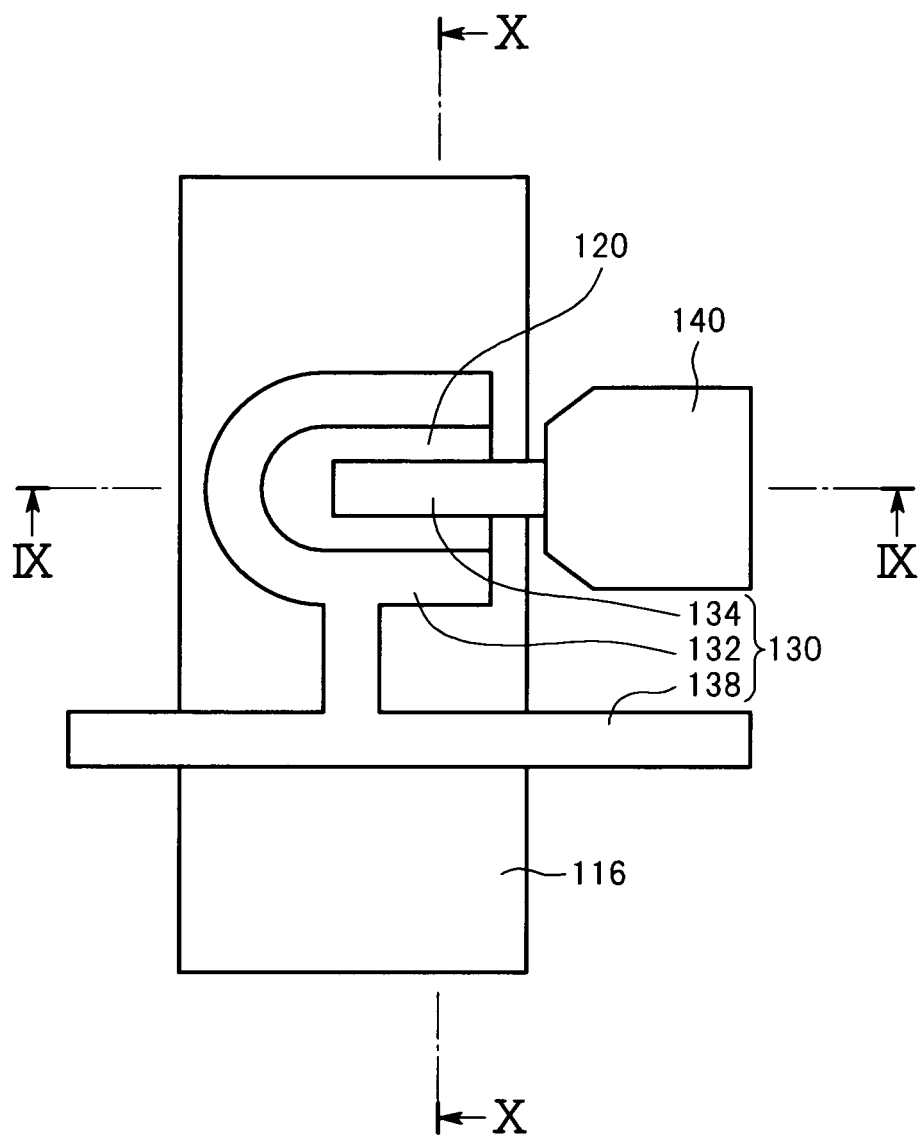

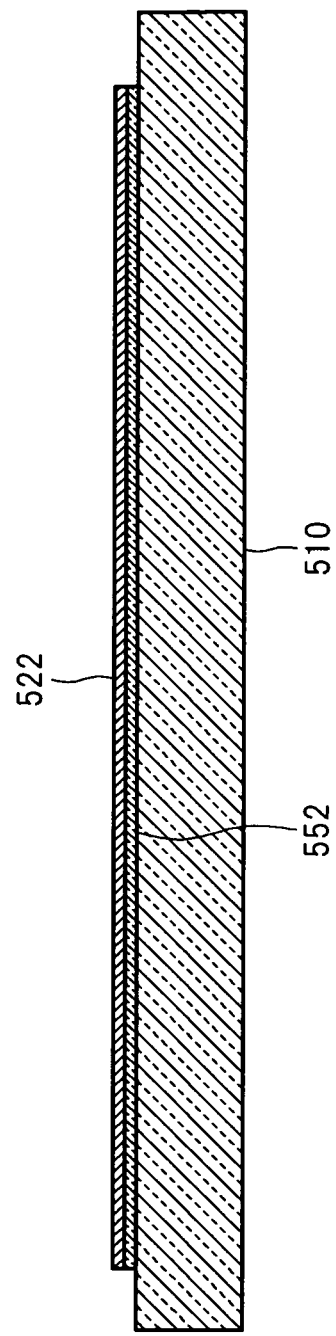

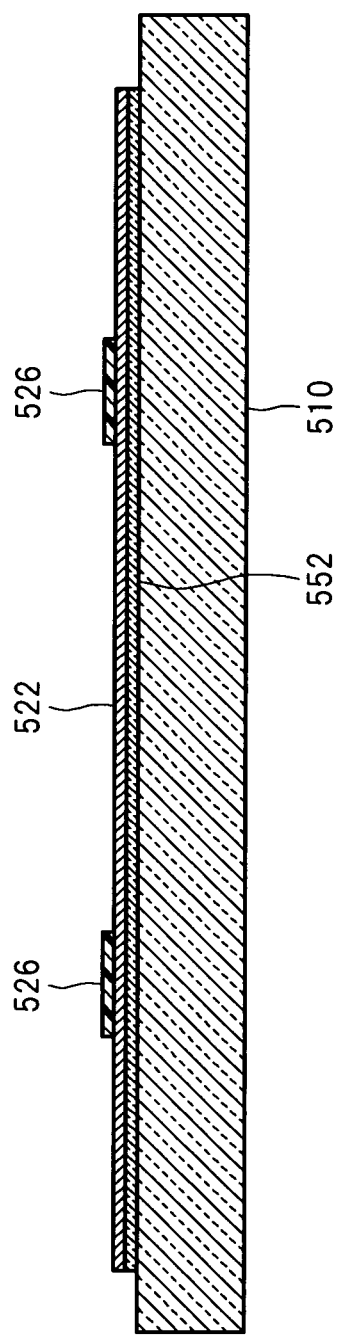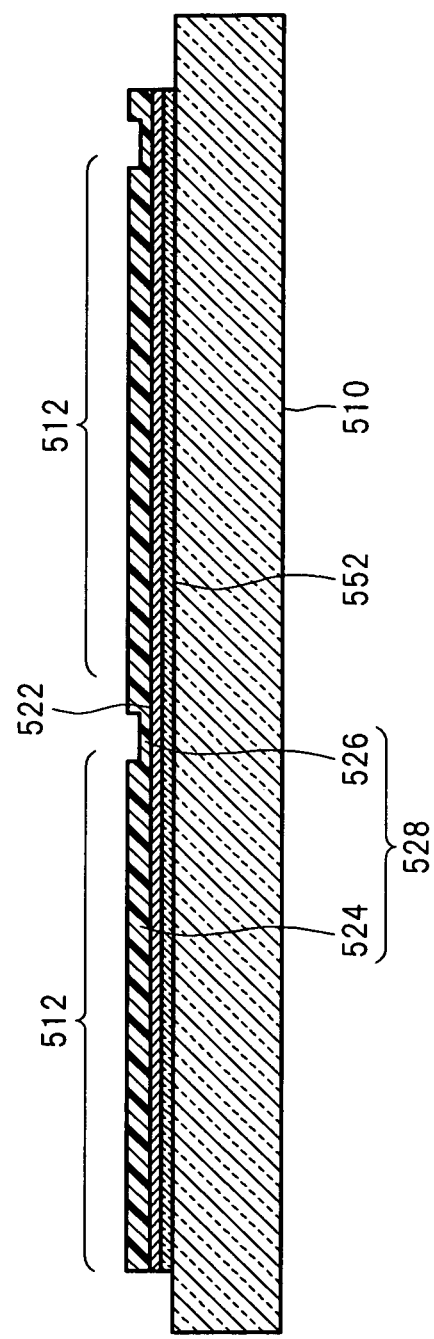

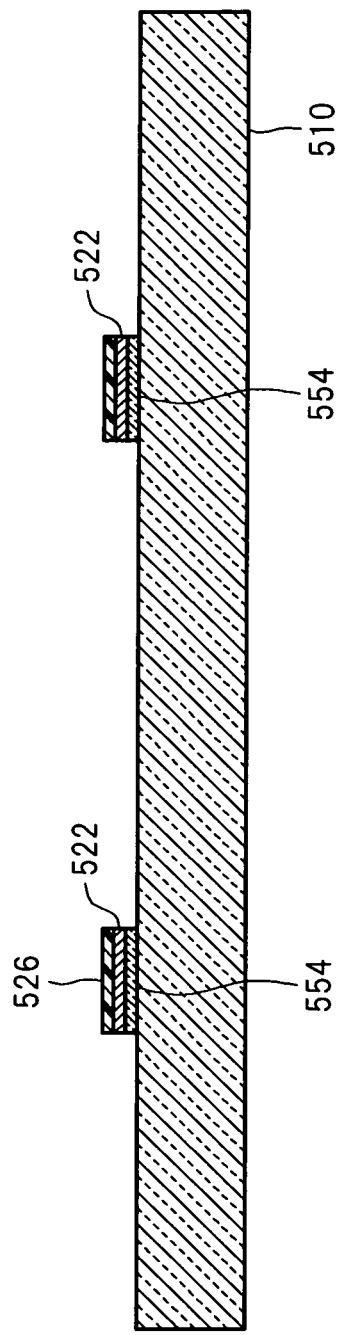
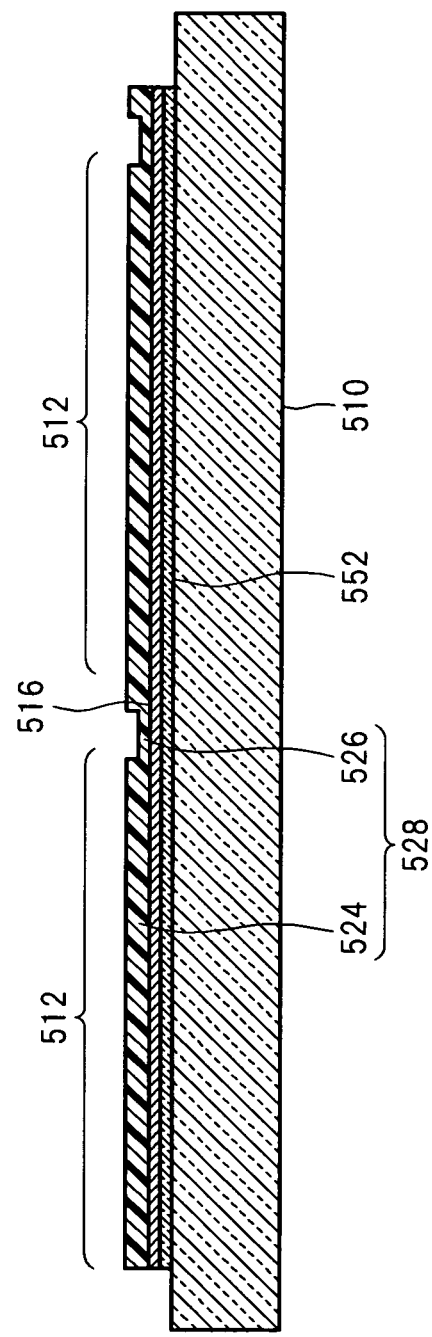
FIG.16A
FIG.16B

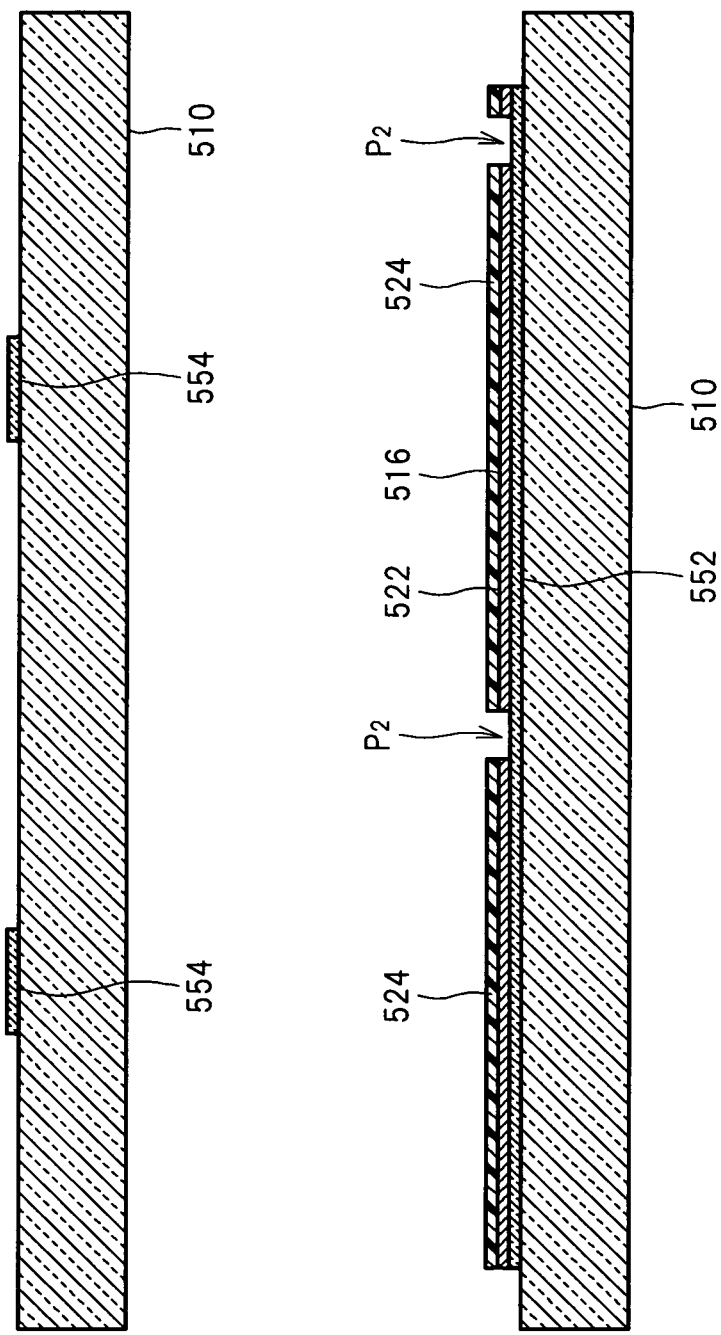

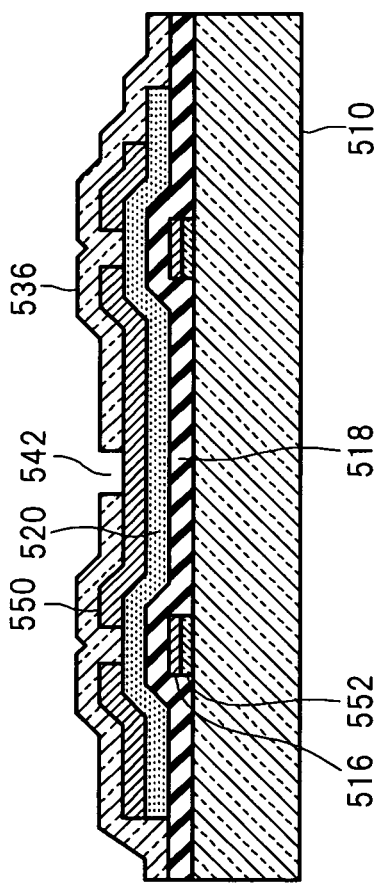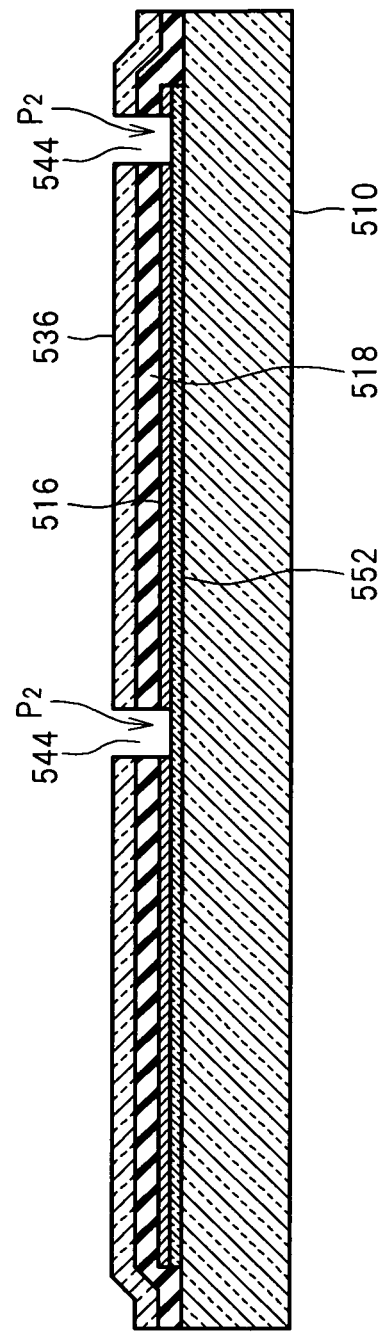
FIG.21A
FIG.21B

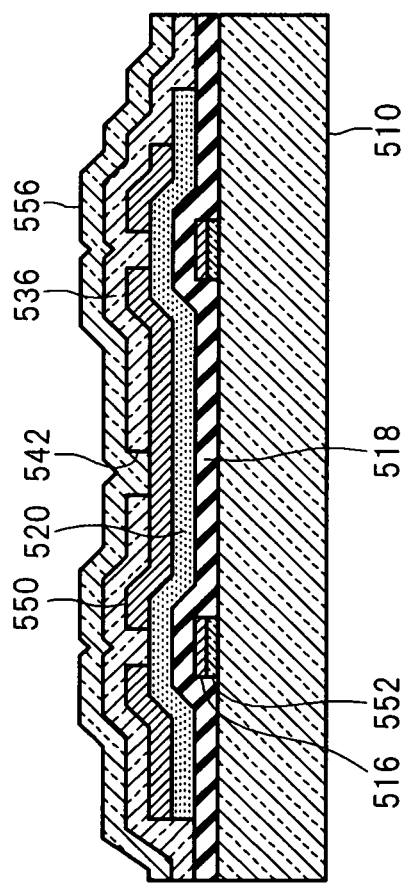
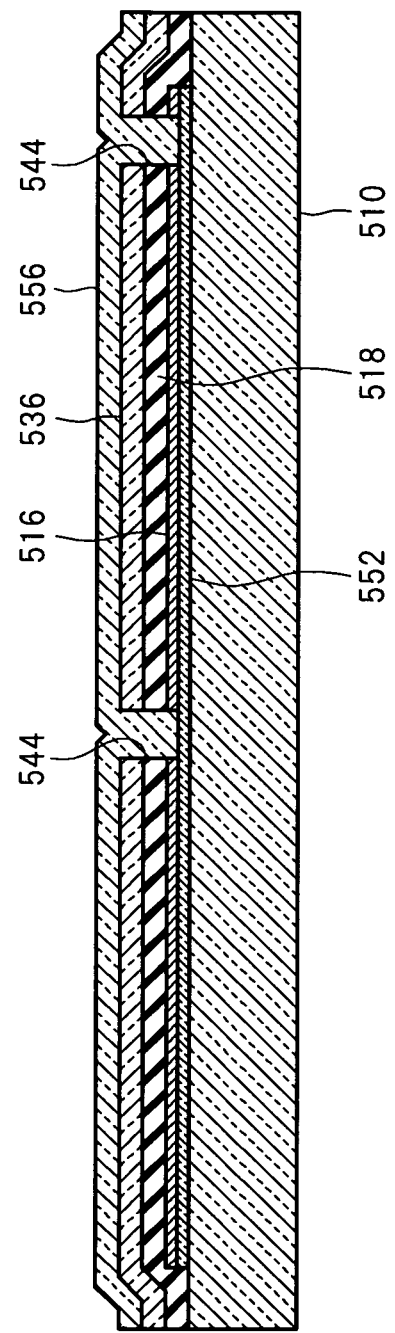
FIG.22A
FIG.22B

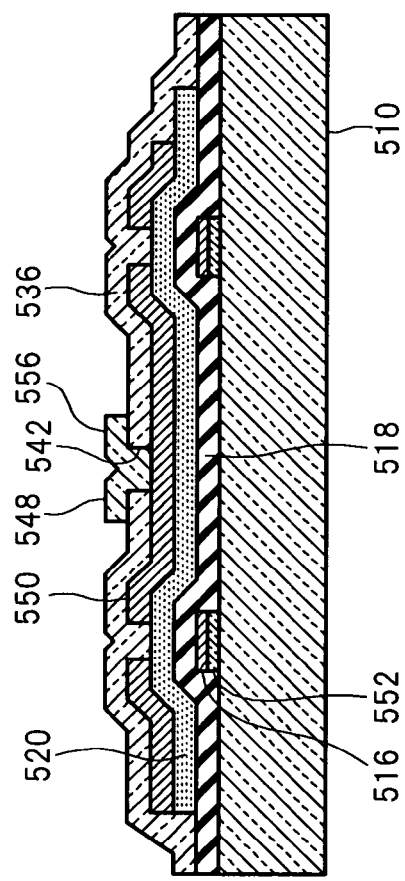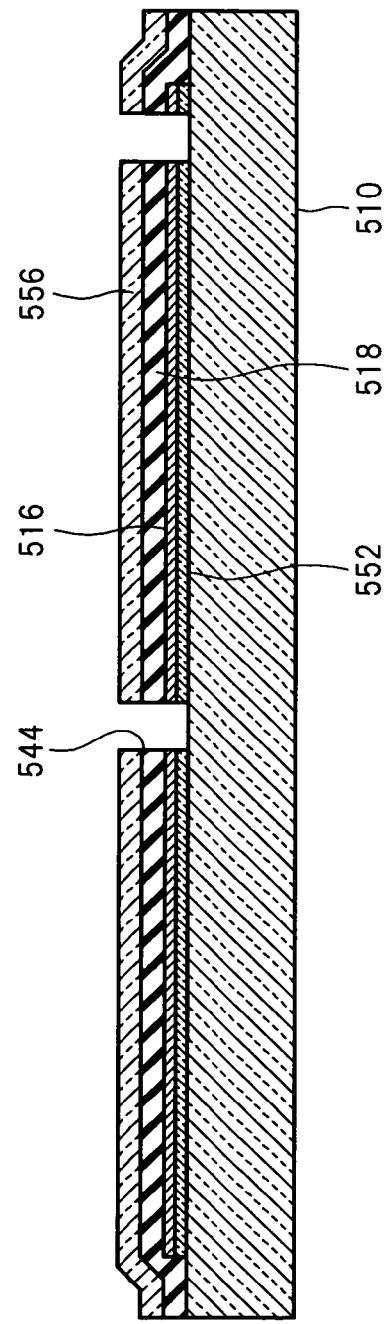
FIG.23A
FIG.23B

<br>

DISPLAY DEVICE AND MANUFACTURING METHOD THEREOF

CROSS-REFERENCE TO RELATED APPLICATION

The present application claims priority from Japanese applications JP 2009-191313 filed on Aug. 20, 2009 and JP 2009-191316 filed on Aug. 20, 2009, the contents of which are hereby incorporated by reference into this application.

BACKGROUND OF THE INVENTION

1. Field of the Invention

The present invention relates to a display device and a manufacturing method therefor.

2. Description of the Related Art

It is known to integrally manufacture a plurality of display panels using a mother substrate, and then cut the resultant mother substrate into individual display panels (Japanese Patent Application Laid-open No. Hei 09-138418 and Japanese Patent Application Laid-open No. Hei 10-20288). Taking a liquid crystal display panel as an example, a pair of mother glass substrates are used, in which one mother glass substrate is cut into thin film transistor (TFT) substrates and the other is cut into color filter substrates.

The individual display panels are provided with a large number of wirings. The wirings of adjacent display panels are formed as being electrically connected to each other in advance, and the mother substrate is cut after a test. In this way, the test on the plurality of display panels may be performed at a time to bring efficiency to a test process.

In the above-mentioned process, the cutting of the wirings is accompanied by the cutting of the mother substrate, and hence the individual display panels each have an end surface exposing cross-sections of the wirings. The exposed cross-section of the wiring causes a problem due to static electricity or electrolytic corrosion. It is conceivable to avoid the wiring exposing its cross-section by cutting the mother substrate after removing the wiring in the vicinity of each cutting line of the mother substrate. In this case, however, there is another problem that an additional removing process for the wiring is required.

SUMMARY OF THE INVENTION

The present invention has an object to provide a manufacturing method for a display device, with which an influence caused by exposed wirings may be prevented without increasing the number of processes.

(1) A manufacturing method for a display device according to one aspect of the present invention includes: a step (a) of forming a semiconductor layer above a substrate; a step (b) of forming a metallic layer on the semiconductor layer; a step (c) of forming, on the metallic layer, an etching resist including a first portion and a second portion, the first portion being thicker than the second portion; a step (d) of etching and patterning the semiconductor layer and the metallic layer through the etching resist so as to form a wiring from the metallic layer and leave the semiconductor layer under the wiring; a step (e) of conducting an electrical test on the wiring; a step (f) of thinning the etching resist to remove the second portion while leaving the first portion unremoved; a step (g) of performing selective etching through the first portion, which is left unremoved, so as to leave the semiconductor layer unetched, to thereby pattern the wiring to be divided into a drain electrode and a source electrode; and a step (h) of cutting the substrate, in which the step (g) of patterning the wiring includes etching the wiring to be cut at a position closer to a cutting line of the substrate with respect to the drain electrode and the source electrode, while leaving the semiconductor layer unetched. According to the present invention, the wiring is cut at the same time as an originally-defined process, and hence the influence caused by exposed wirings may be prevented without increasing the number of processes.

(2) The manufacturing method for a display device according to Item (1) may further include: a step (i) of forming a passivation film over the wiring before the step (h) of cutting the substrate and after the step (g) of patterning the wiring; and a step (j) of etching the passivation film to form a through hole in the passivation film, which is used for establishing electrical connection to the wiring, in which the step (j) of etching the passivation film may include etching the passivation film and the semiconductor layer so that one of a passing through hole and a notch is formed in the passivation film at the position closer to the cutting line of the substrate with respect to the drain electrode and the source electrode, and that the semiconductor layer is cut, which is left unetched after the wiring is cut.

(3) A display device according to one aspect of the present invention includes: a substrate; a semiconductor layer formed above the substrate; a wiring formed in part on the semiconductor layer; and a passivation film covering the semiconductor layer and the wiring, in which: the semiconductor layer includes a first portion and a second portion, the first portion being located under the wiring, the second portion protruding from the wiring from the first portion along a longitudinal direction of the wiring; the passivation film includes one of a passing through hole and a notch formed therein; and the second portion of the semiconductor layer has a leading end surface, which is flush with a plane of the one of the passing through hole and the notch.

(4) A manufacturing method for a display device according to another aspect of the present invention includes: a step (a) of forming, on a substrate, a first oxide conductive film including an oxide semiconductor; a step (b) of forming a first metallic layer on the first oxide conductive film; a step (c) of forming, on the first metallic layer, an etching resist including a first portion and a second portion, the first portion being thicker than the second portion; a step (d) of etching and patterning the first oxide conductive film and the first metallic layer through the etching resist so as to form a common electrode from the first oxide conductive film and form a gate wiring from the first metallic layer, while leaving a portion of the first metallic layer on the common electrode and leaving a portion of the first oxide conductive film under the gate wiring; a step (e) of conducting an electrical test on the gate wiring; a step (f) of thinning the etching resist to remove the second portion while leaving the first portion unremoved; a step (g) of performing selective etching through the first portion, which is left unremoved, so as to leave the first oxide conductive film unetched, to thereby remove the portion of the first metallic layer on the common electrode; a step (h) of forming a gate insulating film over the gate wiring; a step (i) of forming, on the gate insulating film, a patterned semiconductor layer and a patterned signal wiring on the patterned semiconductor layer; a step (j) of forming, over the patterned signal wiring, a passivation film including a semiconductor compound having insulating properties; a step (k) of etching the passivation film to form a through hole in the passivation film, which is used for establishing electrical connection to the patterned signal wiring; a step (l) of forming a second oxide conductive film on the passivation film and inside the through hole on the patterned signal wiring, the second oxide conductive film including the oxide semiconductor; a step (m) of etching the second oxide conductive film to form a pixel electrode; and a step (n) of cutting the substrate after the step (m) of forming the pixel electrode, in which: the step (g) of removing the portion of the first metallic layer on the common electrode includes etching the gate wiring to be cut at a second position of the gate wiring closer to a cutting line of the substrate with respect to a first position at which the semiconductor layer is formed, while leaving the first oxide conductive film unetched at the second position at which the gate wiring is etched; the step (k) of etching the passivation film includes forming one of a passing through hole and a notch in the passivation film and the gate insulating film at the second position, the one of the passing through hole and the notch having a size containing a width of the first oxide conductive film left at the second position; the step (l) of forming the second oxide conductive film includes further forming the second oxide conductive film on a portion of the first oxide conductive film corresponding to the one of the passing through hole and the notch; and the step (m) of etching the second oxide conductive film includes further etching the portion of the first oxide conductive film corresponding to the one of the passing through hole and the notch, to thereby cut the first oxide conductive film. According to the present invention, the gate wiring and the first oxide conductive film formed thereunder are cut at the same time as an originally-defined process, and hence the influence caused by exposed gate wirings and first oxide conductive films may be prevented without increasing the number of processes.

(5) A display device according to another aspect of the present invention includes: a substrate; a first oxide conductive film; a gate wiring including a metallic layer; a gate insulating film covering the gate wiring; a semiconductor layer formed on the gate insulating film; a signal wiring formed in part on the semiconductor layer; a passivation film including a through hole formed therein on the signal wiring, the passivation film covering the semiconductor layer and the signal wiring; and a pixel electrode including a second oxide conductive film, which is formed on the passivation film so as to be electrically connected to the signal wiring via the through hole, in which: the first oxide conductive film constitutes in part a common electrode facing the pixel electrode, and is located in another part under the gate wiring; the gate insulating film and the passivation film include one of a passing through hole and a notch, which is formed in communication with the gate insulating film and the passivation film; and each of the gate wiring and the first oxide conductive film under the gate wiring has an end surface, which is flush with a plane of the one of the passing through hole and the notch.

(6) A manufacturing method for a display device according to still another aspect of the present invention includes: a step (a) of forming a wiring on a substrate, the wiring being patterned to include a drain electrode and a source electrode which are separate from each other; a step (b) of conducting an electrical test on the patterned wiring; a step (c) of forming a passivation film over the patterned wiring; a step (d) of etching the passivation film to form a through hole in the passivation film, which is used for establishing electrical connection to the patterned wiring; a step (e) of forming a metallic layer on the passivation film and inside the through hole on the patterned wiring; a step (f) of etching the metallic layer to form a pixel electrode; and a step (g) of cutting the substrate, in which: the step (d) of etching the passivation film includes forming one of a passing through hole and a notch in the passivation film at a position of the patterned wiring closer to a cutting line of the substrate with respect to the drain electrode and the source electrode, the one of the passing through hole and the notch having a size containing a width of the patterned wiring; the step (e) of forming the metallic layer includes further forming the metallic layer on a portion of the patterned wiring corresponding to the one of the passing through hole and the notch; and the step (f) of etching the metallic layer includes further etching the portion of the patterned wiring corresponding to the one of the passing through hole and the notch, to thereby cut the patterned wiring. According to the present invention, the wiring is cut at the same time as an originally-defined process, and hence the influence caused by exposed wirings may be prevented without increasing the number of processes.

(7) A display device according to still another aspect of the present invention includes: a substrate; a semiconductor layer formed above the substrate; a wiring formed in part on the semiconductor layer; a passivation film including a through hole formed therein at a position on the wiring, the passivation film covering the semiconductor layer and the wiring; and a pixel electrode formed on the passivation film so as to be electrically connected to the wiring via the through hole, in which the passivation film includes one of a passing through hole and a notch, and the wiring has a leading end surface, which is flush with a plane of the one of the passing through hole and the notch.

(8) A manufacturing method for a display device according to still another aspect of the present invention includes: a step (a) of forming a gate wiring on a substrate; a step (b) of conducting an electrical test on the gate wiring; a step (c) of forming a gate insulating film over the gate wiring; a step (d) of forming, on the gate insulating film, a patterned semiconductor layer and a patterned signal wiring on the patterned semiconductor layer; a step (e) of forming a passivation film over the patterned signal wiring; a step (f) of etching the passivation film to form a through hole in the passivation film, which is used for establishing electrical connection to the patterned signal wiring; a step (g) of forming a metallic layer over the passivation film and in the through hole on the patterned signal wiring; a step (h) of etching the metallic layer to form a pixel electrode; and a step (i) of cutting the substrate after the step (h) of forming the pixel electrode, in which: the step (f) of etching the passivation film includes forming one of a passing through hole and a notch in the passivation film and the gate insulating film at a position of the gate wiring closer to a cutting line of the substrate with respect to the semiconductor layer, the one of the passing through hole and the notch having a size containing a width of the gate wiring; the step (g) of forming the metallic layer includes further forming the metallic layer on a portion of the gate wiring corresponding to the one of the passing through hole and the notch; and the step (h) of etching the metallic layer includes further etching the portion of the gate wiring corresponding to the one of the passing through hole and the notch, to thereby cut the gate wiring. According to the present invention, the gate wiring is cut at the same time as an originally-defined process, and hence the influence caused by exposed gate wirings may be prevented without increasing the number of processes.

(9) A display device according to still another aspect of the present invention includes: a substrate; a gate wiring; a gate insulating film covering the gate wiring; a semiconductor layer formed on the gate insulating film; a signal wiring formed in part on the semiconductor layer; a passivation film including a through hole formed therein at a position on the signal wiring, the passivation film covering the semiconductor layer and the signal wiring; and a pixel electrode formed on the passivation film so as to be electrically connected to the signal wiring via the through hole, in which: the gate insulating film and the passivation film include one of a passing through hole and a notch, which is formed in communication with the gate insulating film and the passivation film; and the gate wiring has a leading end surface, which is flush with a plane of the one of the passing through hole and the notch.

BRIEF DESCRIPTION OF THE DRAWINGS

In the accompanying drawings:

FIG. 8 is a partial plan view of the display device to which the present invention is applied;

FIG. 14 illustrates a manufacturing method for a display device according to a third embodiment of the present invention;

FIGS. 15A and 15B illustrate the manufacturing method for a display device according to the third embodiment of the present invention;

FIGS. 16A and 16B illustrate the manufacturing method for a display device according to the third embodiment of the present invention;

FIGS. 18A and 18B illustrate the manufacturing method for a display device according to the third embodiment of the present invention;

FIGS. 21A and 21B illustrate the manufacturing method for a display device according to the third embodiment of the present invention;

FIGS. 22A and 22B illustrate the manufacturing method for a display device according to the third embodiment of the present invention;

FIGS. 23A and 23B illustrate the manufacturing method for a display device according to the third embodiment of the present invention;

DETAILED DESCRIPTION OF THE INVENTION

Hereinafter, embodiments of the present invention are described with reference to the accompanying drawings.

First Embodiment

FIG. 1A to FIG. 7B illustrate a manufacturing method for a display device according to a first embodiment of the present invention.

Figure 1A:
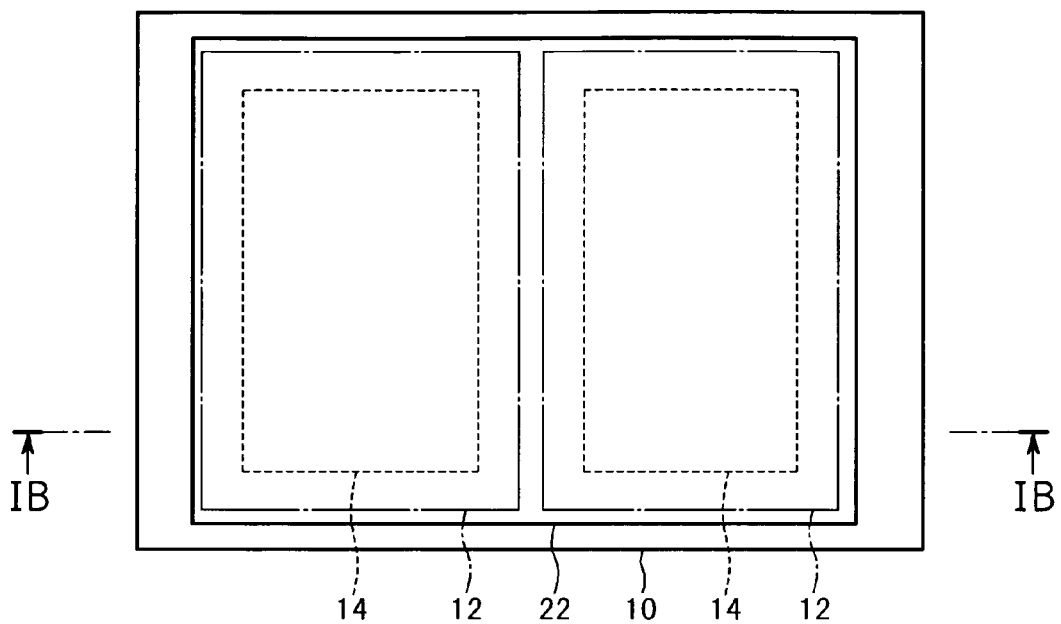
FIGS. 1A and 1B illustrate a manufacturing method for a display device according to a first embodiment of the present invention.
Figure 1B:
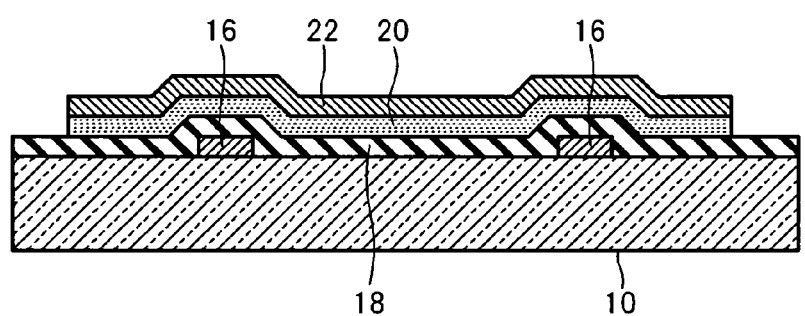

In this embodiment, as illustrated in FIGS. 1A and 1B, a substrate 10 is prepared. FIG. 1B is a cross-sectional view taken along the line IB-IB of a structure illustrated in FIG. 1A. The substrate 10 is made of glass, for example, and is often required to have optical transparency. The substrate 10 is a mother substrate for manufacturing a plurality of display devices integrally. One substrate 10 has a plurality of product areas 12 (areas corresponding to display device components), and each of the product areas 12 has an effective display area 14 (image display area).

Taking a liquid crystal display panel as an example of the display device, the substrate 10 is a thin film transistor (TFT) substrate (or array substrate) including thin-film field-effect transistors, pixel electrodes, wirings, and the like. It should be noted that the liquid crystal display panel may employ any drive mode, such as an in-plane switching (IPS) mode, a twisted nematic (TN) mode, and a vertical alignment (VA) mode, and electrodes and wirings are formed according to the mode. Further, the display device according to the present invention is not limited to the liquid crystal display panel, and may be an electroluminescent display device.

On the substrate 10, gate wirings 16 are formed. The gate wirings 16 serve in part as gate electrodes of the field-effect transistors. In other words, this embodiment describes a bottom-gate field-effect transistor, whose gate electrode is located downward. Over the gate wirings 16, a gate insulating film 18, such as a silicon nitride film, is formed.

Above the substrate 10 (on the gate insulating film 18), a semiconductor layer 20, such as an amorphous silicon layer, is formed. The semiconductor layer 20 is formed integrally over the plurality of product areas 12. Using the semiconductor layer 20, a source region, a drain region, and a channel region of each field-effect transistor are formed through the processes described later. The semiconductor layer 20 and the gate wirings 16 are electrically insulated from each other by the gate insulating film 18.

On the semiconductor layer 20, a metallic layer 22 is formed. The metallic layer 22 is also formed integrally over the plurality of product areas 12. Using the metallic layer 22, a source electrode 34 and a drain electrode 32 of each field-effect transistor are formed through the process (FIG. 5) described later.

Figure 2A:
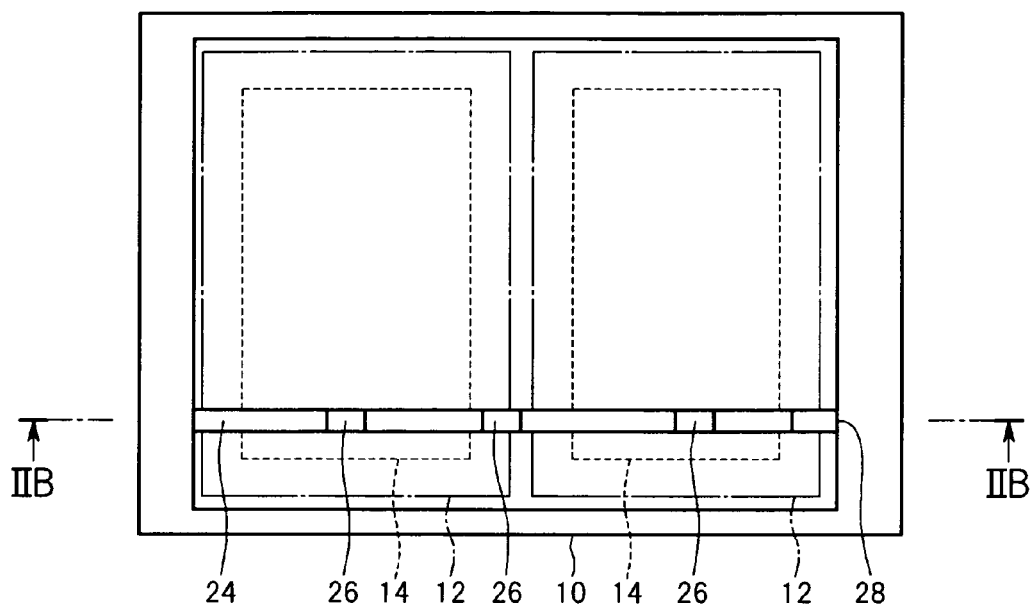
FIGS. 2A and 2B illustrate the manufacturing method for a display device according to the first embodiment of the present invention.
Figure 2B:
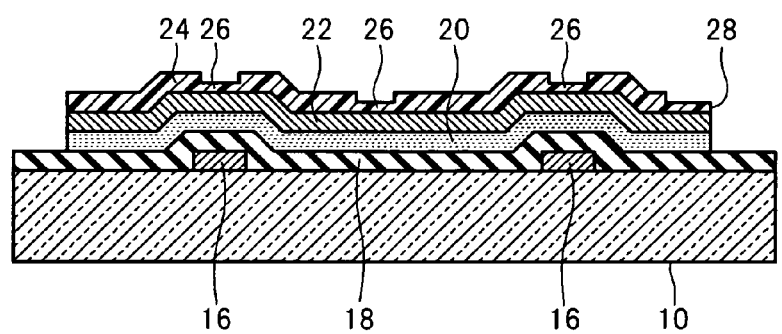

As illustrated in FIGS. 2A and 2B, on the metallic layer 22, an etching resist 28 is formed, which has first portions 24 being thick and second portions 26 being thin (the first portions 24 are thicker than the second portions 26). FIG. 2B is a cross-sectional view taken along the line IIB-IIB of the structure illustrated in FIG. 2A.

The etching resist 28 is formed by patterning a photoresist using photolithography. In particular, the difference in thickness between the first portion 24 and the second portion 26 may be formed by half-tone exposure in photolithographic exposure. FIG. 2A illustrates only a part of the etching resist 28, and omits other parts thereof.

The overall etching resist 28 including the first portions 24 and the second portions 26 is formed across the plurality of product areas 12. The first portions 24 of the etching resist 28 are located on the metallic layer 22 corresponding to wiring portions. The second portion 26 being thin is located in a region (channel region) between the source electrode 34 and the drain electrode 32 of each field-effect transistor (FIG. 5), as well as on an end of each product area 12.

Figure 3:
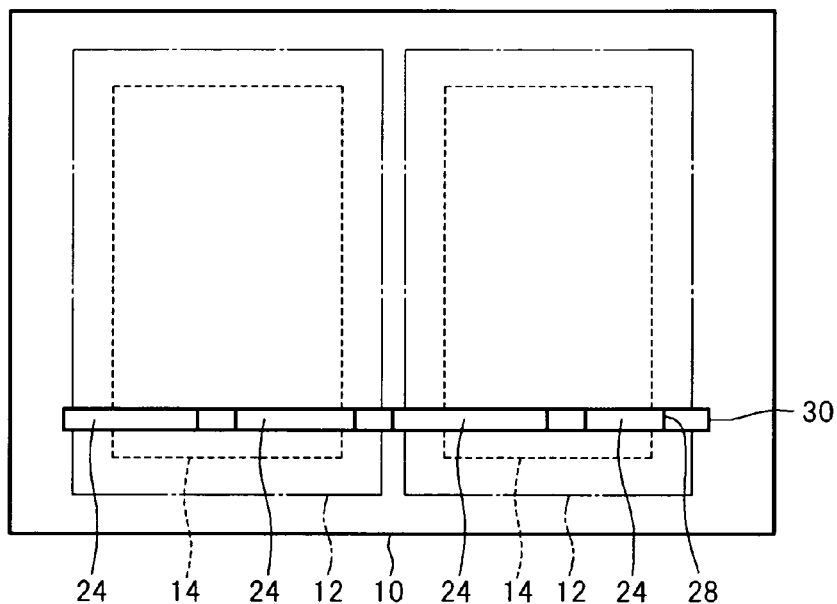
FIG. 3 illustrates the manufacturing method for a display device according to the first embodiment of the present invention.

As illustrated in FIG. 3, through the etching resist 28, the semiconductor layer 20 and the metallic layer 22 are patterned by etching. The etching of the two layers may be performed simultaneously (once) or separately (twice), depending on the type of etching. By the etching, a wiring 30 is formed from the metallic layer 22, and the semiconductor layer 20 is left under the wiring 30.

Then, an electrical test (such as a test as for disconnection or short-circuit) is conducted on the wiring 30. In conducting the electrical test, the wiring 30 extends continuously across the plurality of product areas 12. Therefore, the electrical test on the plurality of product areas 12 may be conducted at a time.

Figure 4:
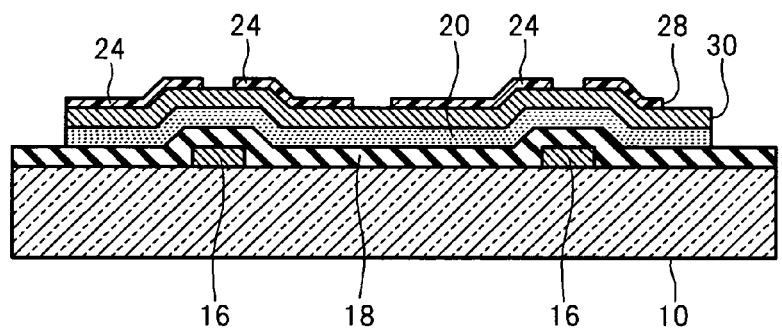
FIG. 4 illustrates the manufacturing method for a display device according to the first embodiment of the present invention.

As illustrated in FIG. 4, for example, ashing is performed to thin the etching resist 28 so that the second portions 26 being thin may be removed while leaving the first portions 24 unremoved. This process may be performed after the electrical test or before the electrical test.

Figure 5:
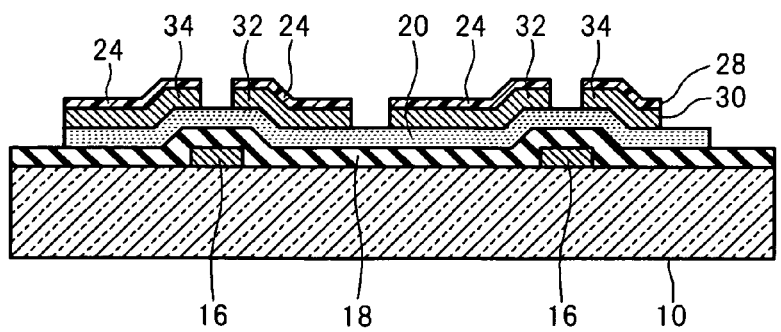
FIG. 5 illustrates the manufacturing method for a display device according to the first embodiment of the present invention.

The first portions 24 are located at least in respective regions for forming the source electrode 34 and the drain electrode 32 of each field-effect transistor (FIG. 5). After the removal of the second portions 26 being thin, the wiring 30 is exposed from the etching resist 28 in part on the channel region of each field-effect transistor.

In the example illustrated in FIG. 4, the wiring 30 is also exposed from the etching resist 28 in part on the end of each product area 12 (FIG. 3). Specifically, the wiring 30 is partially exposed from the etching resist 28 continuously from inside to outside the end of each product area 12 (along a cutting line of the substrate 10; see FIG. 7A). The wiring 30 is partially exposed from the etching resist 28 at a position closer to each cutting line of the substrate 10 with respect to portions corresponding to the drain electrode 32 and the source electrode 34 (FIG. 5).

As illustrated in FIG. 5, the wiring 30 is patterned. The patterning is performed through the first portions 24 of the etching resist 28. The patterning is performed using selective etching, which etches the wiring 30 but leaves the semiconductor layer 20 unetched. The patterning enables the wiring 30 to be divided into the drain electrodes 32 and the source electrodes 34. At the same time, the wiring 30 is cut at the position closer to each cutting line of the substrate 10 with respect to the drain electrode 32 and the source electrode 34. In the example illustrated in FIG. 5, a portion of the wiring 30 located on the end of each product area 12 is removed by etching. In this case, the wiring 30 is etched, but the semiconductor layer 20 formed thereunder is left unetched. Then, the etching resist 28 is removed.

Figure 6A:
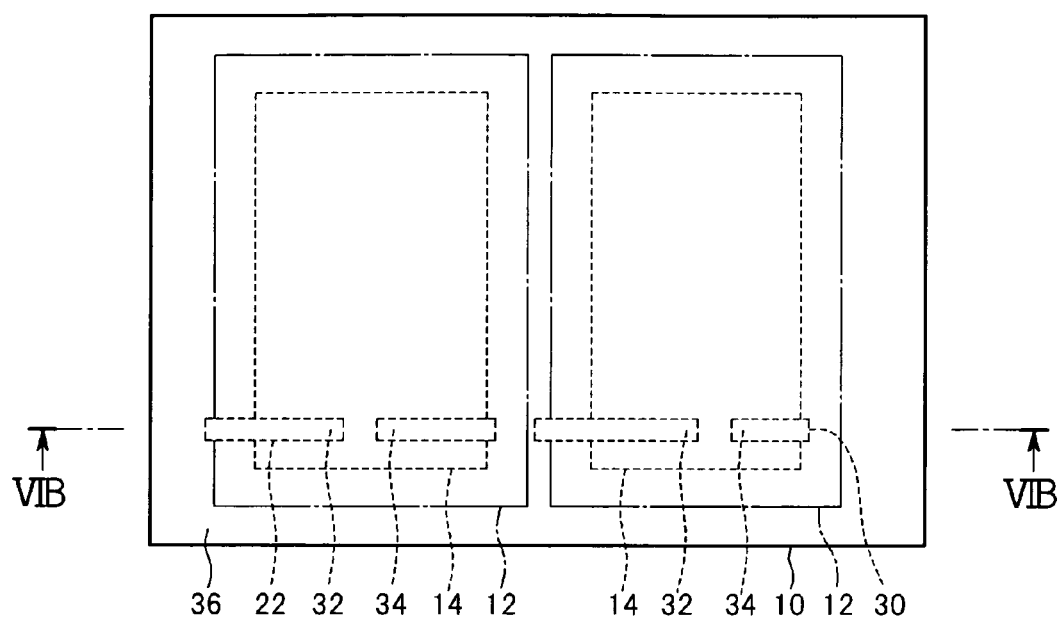
FIGS. 6A and 6B illustrate the manufacturing method for a display device according to the first embodiment of the present invention.
Figure 6B:
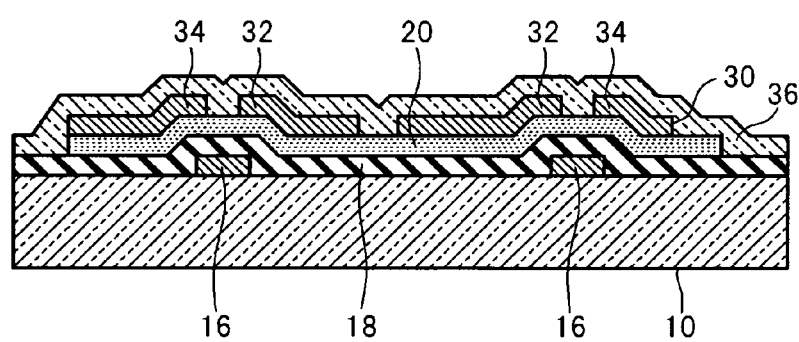

As illustrated in FIGS. 6A and 6B, a passivation film 36, such as a silicon oxide film or a silicon nitride film, is formed over the wiring 30. FIG. 6B is a cross-sectional view taken along the line VIB-VIB of the structure illustrated in FIG. 6A. The passivation film 36 is formed of a semiconductor compound having insulating properties (such as $SiO_2$ or SiN).

Figure 7A:
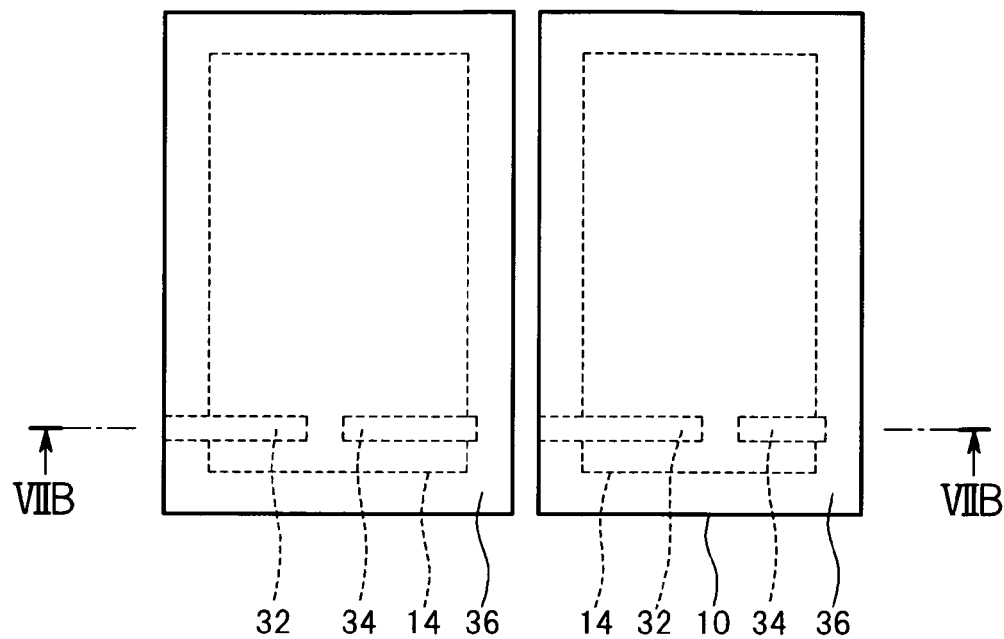
FIGS. 7A and 7B illustrate the manufacturing method for a display device according to the first embodiment of the present invention.
Figure 7B:
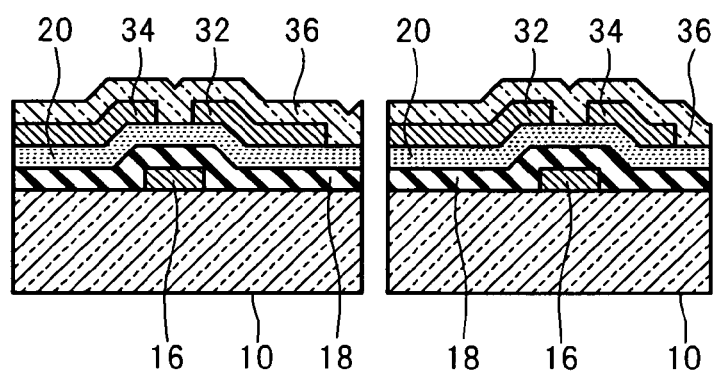

As illustrated in FIGS. 7A and 7B, the substrate 10 is cut. FIG. 7B is a cross-sectional view taken along the line VIIB-VIIB of the structure illustrated in FIG. 7A. At the same time as the cutting of the substrate 10, the passivation film 36, the wiring 30, the semiconductor layer 20, and the gate insulating film 18 are cut as well. In this way, individual TFT substrates are obtained. It should be noted that the substrate 10 may be cut after a counter substrate (color filter substrate) (not shown) is disposed at a distance from the substrate 10 with liquid crystal being sealed between the substrate 10 and the counter substrate. In this case, a display device is obtained.

According to this embodiment, the wiring 30 is cut at the same time as an originally-defined process (process of forming the drain electrode 32 and the source electrode 34) (see FIG. 5). Therefore, an influence caused by exposed wirings 30 may be prevented without increasing the number of processes. For instance, in the example of FIGS. 7A and 7B, the cut surface of the wiring 30 is recessed with respect to the cutting line of the substrate 10, and hence the cut surface may be sealed with ease.

According to this embodiment, in each of the thus cut substrates 10, a part of the wiring 30 (right-hand side of FIG. 7B) is cut to be recessed with respect to the cut surface of the substrate 10, and the cut surface of the wiring 30 is covered with the passivation film 36. Therefore, the drain electrode 32 and the source electrode 34 are prevented from being directly affected by static electricity or electrolytic corrosion, which may be caused by an exposed cut surface of the wiring 30.

It should be noted that, in the example illustrated in FIG. 7B, the wiring 30 has another end to which the present invention is not applied, other than the end to which the present invention is applied. Specifically, in each of the thus cut substrates 10, a part of the wiring 30 (left-hand side of FIG. 7B) has another cut surface which is flush with the cut surface of the substrate 10, showing that the present invention is not applied thereto. The part is covered with a sealing member (not shown). Although not illustrated, as a modification example, the present invention may be applied to all parts of the wiring 30, in which each cut surface of the wiring 30 is positioned inside the cut surface of the substrate 10.

In the above description, the structure is exemplified as being partially simplified for the sake of description. However, it is assumed that an actual structure of the display device to which the present invention is applied is more complicated.

Figure 9:
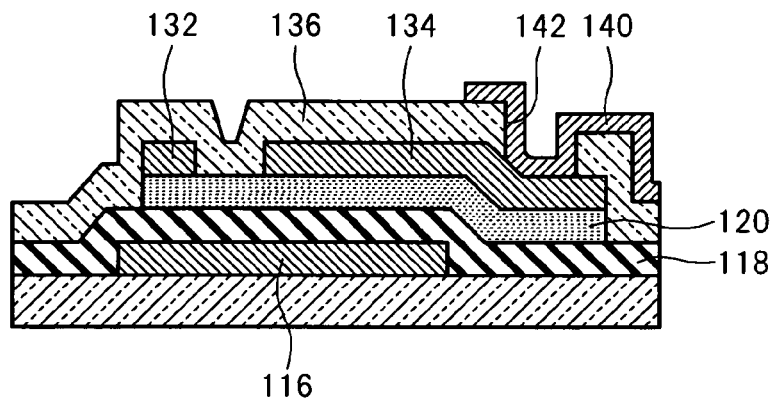
FIG. 9 is a cross-sectional view taken along the line IX-IX of the display device illustrated in FIG. 8.
Figure 10:
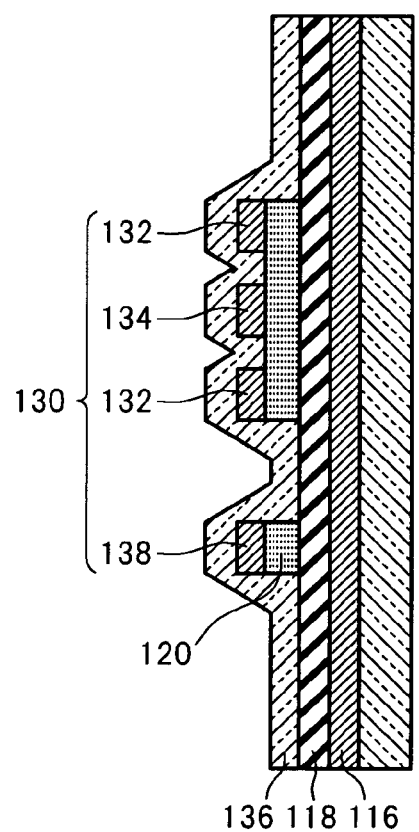
FIG. 10 is a cross-sectional view taken along the line X-X of the display device illustrated in FIG. 8.

FIG. 8 is a partial plan view of the display device to which the present invention is applied. FIG. 9 is a cross-sectional view taken along the line IX-IX of the display device illustrated in FIG. 8. FIG. 10 is a cross-sectional view taken along the line X-X of the display device illustrated in FIG. 8.

In this example, a wiring 130 is divided into a drain electrode 132 and a source electrode 134. The drain electrode 132 is U-shaped so that the linear source electrode 134 enters the U-shape. Although FIG. 8 illustrates one drain electrode 132, a plurality of the drain electrodes 132 are electrically connected by a wiring line 138. In an electrical test on the wiring 130, the wiring line 138 extends continuously across a plurality of product areas.

Formed under the drain electrode 132 and the source electrode 134 is a semiconductor layer 120, formed under the semiconductor layer 120 is a gate insulating film 118, and formed under the gate insulating film 118 is a gate wiring 116. The drain electrode 132 and the source electrode 134 are covered with a passivation film 136, and a pixel electrode 140 is formed on the passivation film 136. The pixel electrode 140 is electrically connected to the source electrode 134 via a through hole 142 formed in the passivation film 136.

Second Embodiment

FIG. 11A to FIG. 13B illustrate a manufacturing method for a display device according to a second embodiment of the present invention. In this embodiment, the same processes as in the first embodiment are performed halfway. Specifically, the processes of the first embodiment described with reference to FIG. 1A to FIG. 6B (up to the process of forming the passivation film 36 over the wiring 30 after the patterning of the wiring 30) are performed. Then, the passivation film 36 is etched before the process of cutting the substrate 10 (see FIGS. 7A and 7B).

Figure 11A:
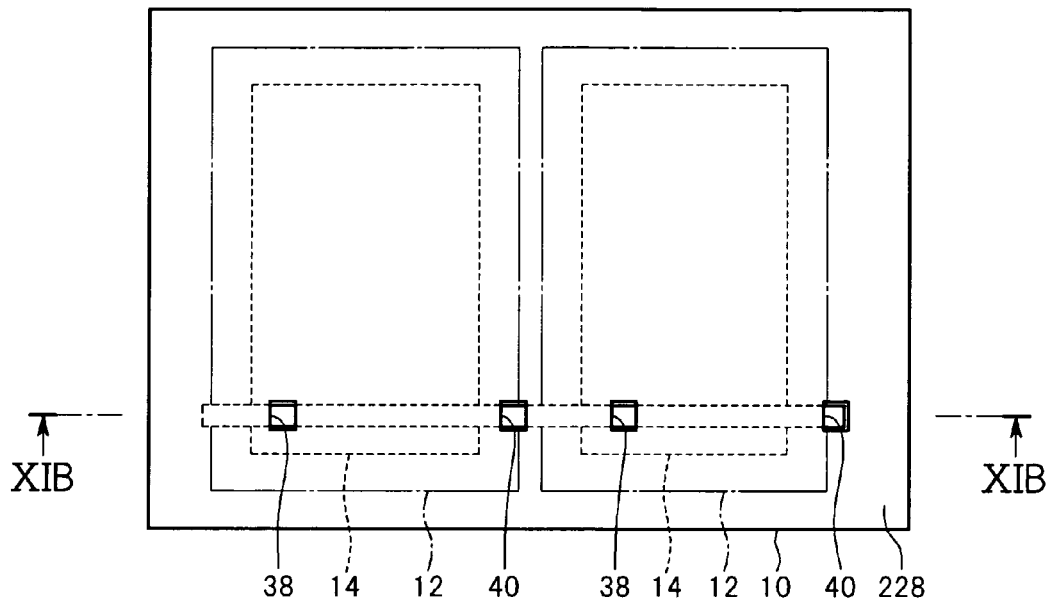
FIGS. 11A and 11B illustrate a manufacturing method for a display device according to a second embodiment of the present invention.
Figure 11B:
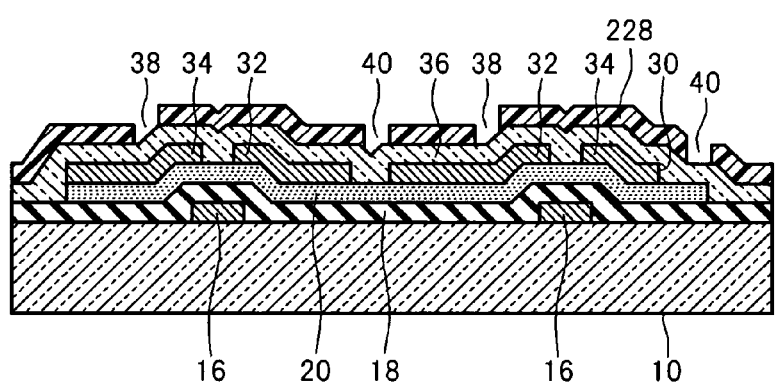

As illustrated in FIGS. 11A and 11B, an etching resist 228 is formed for etching the passivation film 36. FIG. 11B is a cross-sectional view taken along the line XIB-XIB of the structure illustrated in FIG. 11A. The etching resist 228 has first openings 38 and second openings 40, from which the passivation film 36 is exposed. The first openings 38 are formed above the wiring 30 corresponding to portions that need to be electrically connected. The second openings 40 are formed at a position crossing the end of each product area 12 (cutting line).

Figure 12:
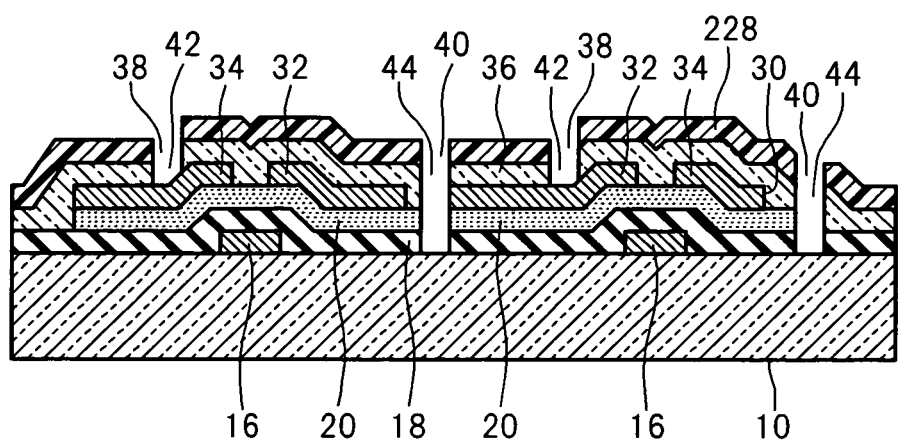
FIG. 12 illustrates the manufacturing method for a display device according to the second embodiment of the present invention.

As illustrated in FIG. 12, the passivation film 36 is etched to form through holes 42 in the passivation film 36, which are used for establishing electrical connection to the wiring 30. This etching is performed through the first openings 38 of the etching resist 228. At the same time, a passing through hole (or notch) 44 is formed in the passivation film 36 by etching at a position closer to each cutting line of the substrate 10 with respect to the drain electrode 32 and the source electrode 34. This etching is performed through the second openings 40 of the etching resist 228. Further, continuously to the etching of the passivation film 36, the semiconductor layer 20 formed under the passivation film 36 is etched. The semiconductor layer 20 concerned corresponds to a part of the semiconductor layer 20 which is left unprocessed after the cutting of the wiring 30 (see FIG. 5). This part is cut by etching. After that, the etching resist 228 is removed.

Figure 13A:
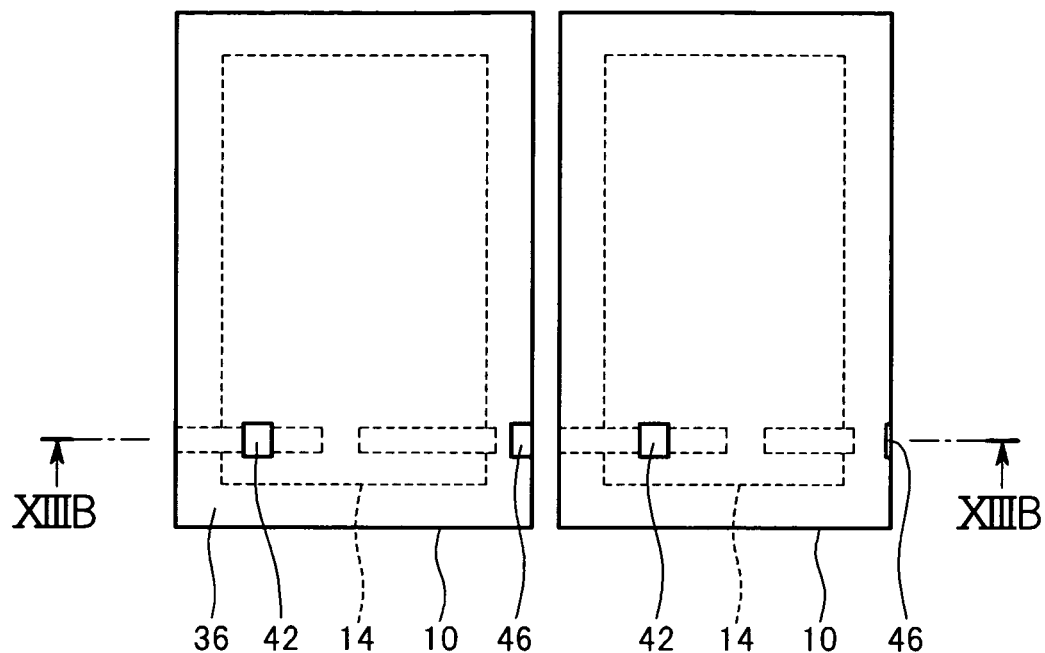
FIGS. 13A and 13B illustrate the manufacturing method for a display device according to the second embodiment of the present invention.
Figure 13B:
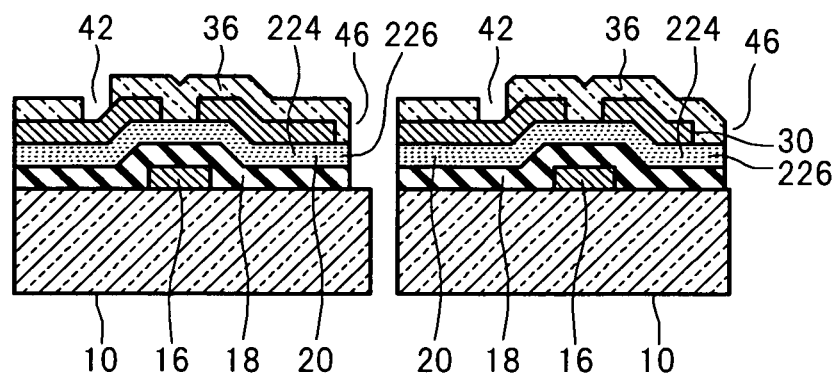

As illustrated in FIGS. 13A and 13B, the substrate 10 is cut. FIG. 13B is a cross-sectional view taken along the line XIIIB-XIIIB of the structure illustrated in FIG. 13A. At the same time as the cutting of the substrate 10, the passivation film 36, the wiring 30, the semiconductor layer 20, and the gate insulating film 18 are cut as well. In this way, individual TFT substrates are obtained. It should be noted that the substrate 10 may be cut after a counter substrate (color filter substrate) (not shown) is disposed at a distance from the substrate 10 with liquid crystal being sealed between the substrate 10 and the counter substrate. In this case, a display device is obtained.

According to this embodiment, in addition to the effect described in the first embodiment, the influence due to static electricity or electrolytic corrosion is further suppressed because the semiconductor layer 20 is also cut to be recessed with respect to the cut surface of the substrate 10. Other details of the manufacturing method according to this embodiment correspond to the contents described in the first embodiment.

The display device according to this embodiment includes the substrate 10, the semiconductor layer 20 formed above the substrate 10, the wiring 30 formed in part on the semiconductor layer 20, and the passivation film 36 covering the semiconductor layer 20 and the wiring 30. The semiconductor layer 20 includes a first portion 224 and a second portion 226, the first portion 224 being located under the wiring 30, the second portion 226 protruding from the wiring 30 from the first portion 224 along a longitudinal direction of the wiring 30. The passivation film 36 has a notch (or passing through hole) 46 formed therein. The second portion 226 of the semiconductor layer 20 has a leading end surface, which is flush with a plane of the notch (or passing through hole) 46. Other details of the display device according to this embodiment encompass such a structure as is obvious from the above-mentioned manufacturing method.

Third Embodiment

FIG. 14 to FIG. 24B illustrate a manufacturing method for a display device according to a third embodiment of the present invention. The display device to be manufactured in this embodiment is a liquid crystal display device using two oxide semiconductor layers, such as an in-plane switching (IPS) liquid crystal display device.

As illustrated in FIG. 14, a first oxide conductive film 552 is formed on a substrate 510. The first oxide conductive film 552 is formed of an oxide semiconductor having conductivity (such as indium tin oxide or indium zinc oxide). The first oxide conductive film 552 is a transparent conductive film. On the first oxide conductive film 552, a first metallic layer 522 is formed.

FIGS. 15A and 15B are cross-sectional views taken along different lines in the same process. There are similar relationships between FIGS. 16A and 16B, FIGS. 17A and 17B, FIGS. 18A and 18B, FIGS. 21A and 21B, FIGS. 22A and 22B, and FIGS. 23A and 23B, respectively.

As illustrated in FIGS. 15A and 15B, on the first metallic layer 522, an etching resist 528 is formed, which has first portions 524 being thick and second portions 526 being thin (the first portions 524 are thicker than the second portions 526). The first portions 524 of the etching resist 528 are located on the first metallic layer 522 corresponding to gate wirings 516 (see FIG. 16B). The second portions 526 being thin are located above the first oxide conductive film 552 corresponding to common electrodes 554 (see FIG. 16A). The second portions 526 are located also on an end of each product area 512, which corresponds to the gate wiring 516 of the first metallic layer 522.

As illustrated in FIGS. 16A and 16B, through the etching resist 528, the first oxide conductive film 552 and the first metallic layer 522 are patterned by etching. Then, the common electrodes 554 are formed from the first oxide conductive film 552. The gate wirings 516 are formed from the first metallic layer 522. The first metallic layer 522 is left on the common electrode 554. The first oxide conductive film 552 is left under the gate wiring 516.

Then, an electrical test is conducted on the gate wiring 516. The gate wiring 516 extends continuously across the plurality of product areas 512. Therefore, the electrical test on the plurality of product areas 512 may be conducted at a time.

Figure 17A:
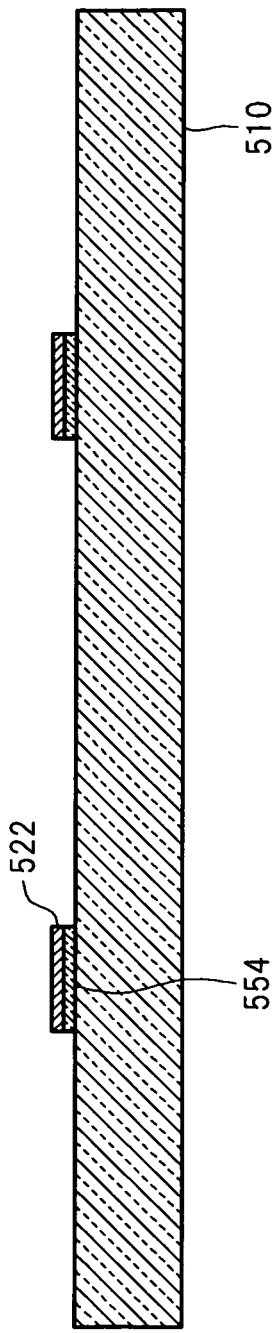
FIGS. 17A and 17B illustrate the manufacturing method for a display device according to the third embodiment of the present invention.
Figure 17B:
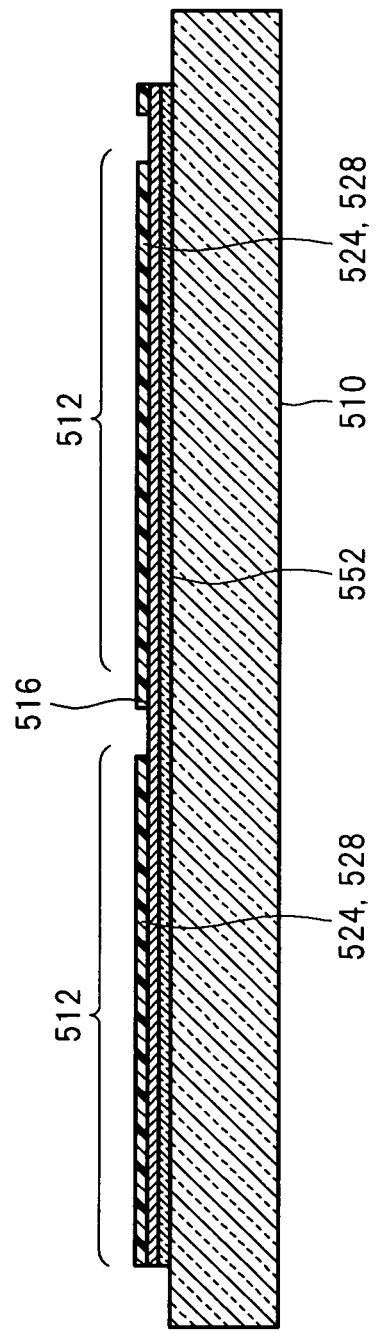

As illustrated in FIGS. 17A and 17B, for example, ashing is performed to thin the etching resist 528 so that the second portions 526 being thin may be removed while leaving the first portions 524 unremoved. This process may be performed after the electrical test or before the electrical test.

As illustrated in FIGS. 18A and 18B, selective etching is performed through the first portions 524 so as to leave the first oxide conductive film 552 unetched, to thereby remove the first metallic layer 522 in part on the common electrodes 554. In this way, a layer which prevents optical transmission of the transparent common electrodes 554 is removed. At the same time, etching is performed so that the gate wiring 516 is cut at a second position $P_2$ of the gate wiring 516 closer to a cutting line of the substrate 510 with respect to a first position $P_1$ intersecting a semiconductor layer 520 three-dimensionally (see FIG. 20). In this case, at the second position $P_2$, the first oxide conductive film 552 under the etched gate wiring 516 is left unetched. According to this embodiment, the gate wiring 516 is cut at the same time as an originally-defined process, and therefore an influence caused by exposed gate wirings 516 may be prevented without increasing the number of processes.

Figure 19:
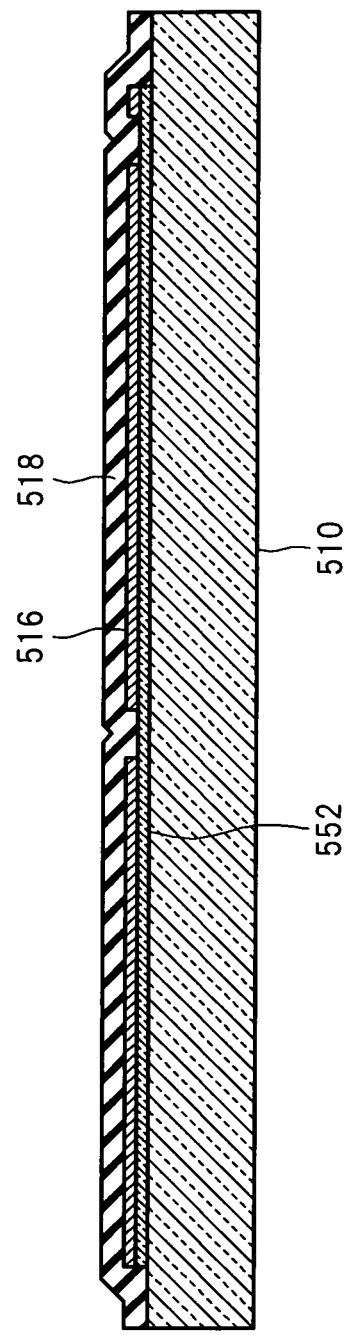
FIG. 19 illustrates the manufacturing method for a display device according to the third embodiment of the present invention.

As illustrated in FIG. 19, a gate insulating film 518 is formed over the gate wiring 516.

Figure 20:
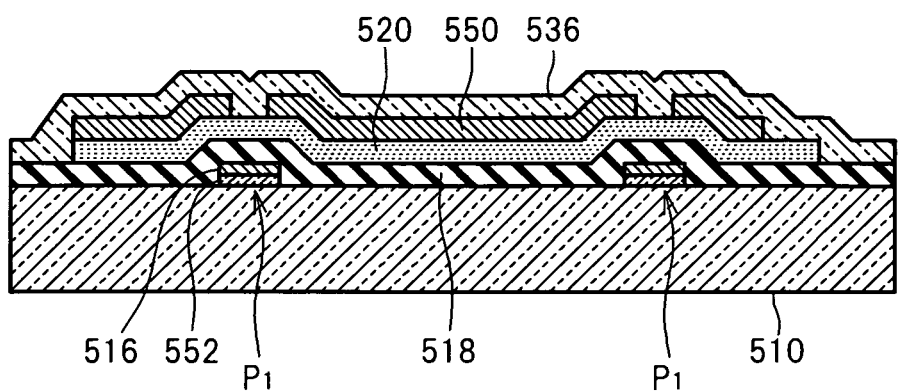
FIG. 20 illustrates the manufacturing method for a display device according to the third embodiment of the present invention.

As illustrated in FIG. 20, the patterned semiconductor layer 520 and a patterned signal wiring 550 on the semiconductor layer 520 are formed on the gate insulating film 518. Further, a passivation film 536 is formed over the signal wiring 550. The passivation film 536 is formed of a semiconductor compound having insulating properties (such as $SiO_2$ or SiN).

As illustrated in FIGS. 21A and 21B, the passivation film 536 is etched to form through holes 542 in the passivation film 536, which are used for establishing electrical connection to the signal wiring 550. At the same time, a passing through hole (or notch) 544 is formed in communication with the passivation film 536 and the gate insulating film 518 at the second position $P_2$, the passing through hole having a size containing a width of the first oxide semiconductor film 552 left at the second position $P_2$.

As illustrated in FIGS. 22A and 22B, a second oxide conductive film 556 is formed over the passivation film 536 and inside the through holes 542 on the signal wiring 550. At the same time, the second oxide conductive film 556 is further formed inside the passing through holes (or notches) 544 on the first oxide conductive film 552. The second oxide conductive film 556 is also formed of an oxide semiconductor having conductivity (such as indium tin oxide or indium zinc oxide) similarly to the first oxide conductive film 552.

As illustrated in FIGS. 23A and 23B, the second oxide conductive film 556 is etched to form a pixel electrode 548. At the same time, a portion of the first oxide conductive film 552 corresponding to the passing through hole (or notch) 544 is also etched to cut the first oxide conductive film 552. According to this embodiment, the first oxide conductive film 552 formed under the gate wiring 516 is cut at the same time as an originally-defined process, and hence an influence caused by exposed gate wirings 516 and first oxide conductive film 552 may be prevented without increasing the number of processes.

Figure 24A:
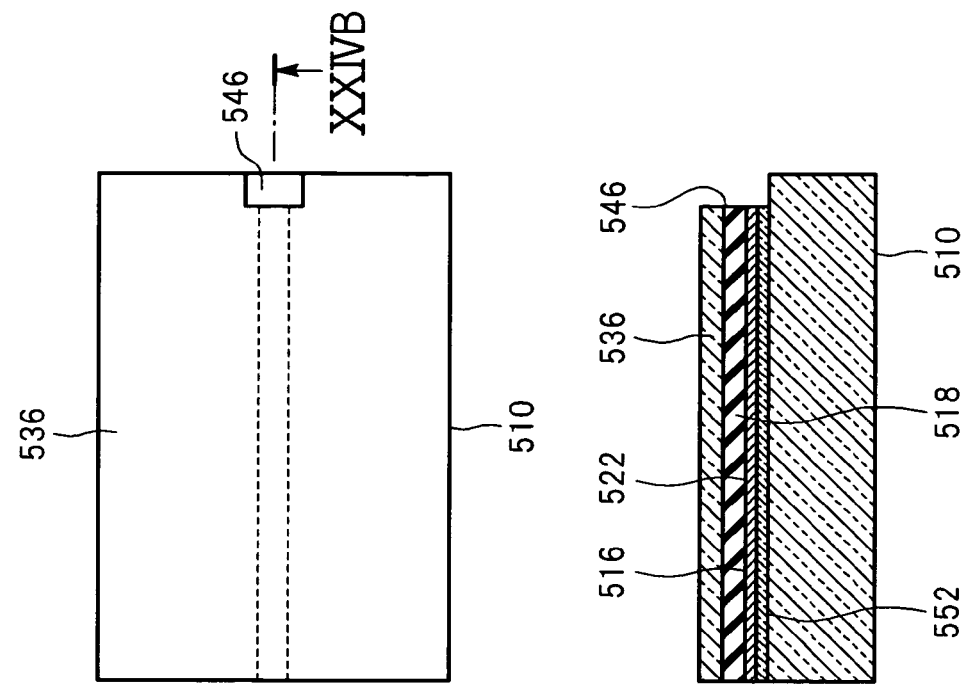
FIGS. 24A and 24B illustrate the manufacturing method for a display device according to the third embodiment of the present invention.
Figure 24B:
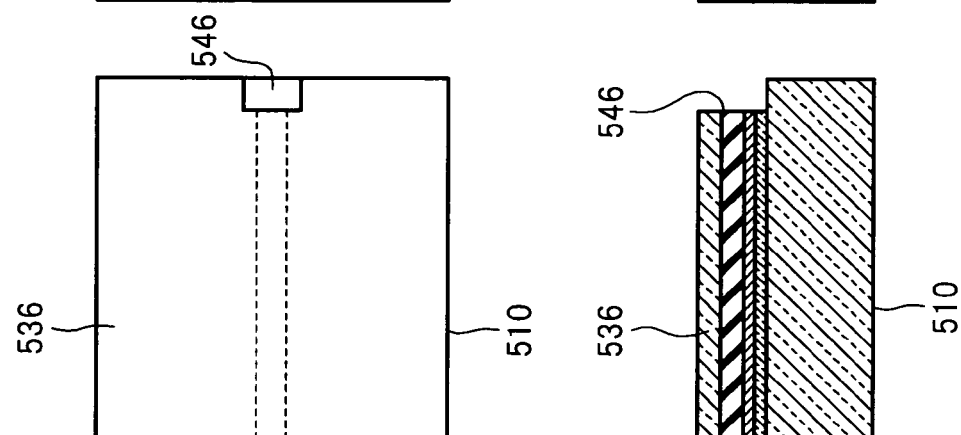

After the formation of the pixel electrode 548, as illustrated in FIGS. 24A and 24B, the substrate 510 is cut. It should be noted that FIG. 24B is a cross-sectional view taken along the line XXIVB-XXIVB of the structure illustrated in FIG. 24A. In this way, individual TFT substrates are obtained, and a display device is obtained when a counter substrate (color filter substrate) (not shown) is disposed and then the substrate 510 and the counter substrate are cut. Other details of this embodiment correspond to the contents described in the first embodiment.

The display device according to this embodiment includes the substrate 510, the first oxide conductive film 552, the gate wirings 516 formed from the first metallic layer 522, the gate insulating film 518 covering the gate wirings 516, the semiconductor layer 520 formed on the gate insulating film 518, and the signal wirings 550 formed in part on the semiconductor layer 520 (see FIG. 23A). The passivation film 536 covers the semiconductor layer 520 and the signal wirings 550, and has the through holes 542 formed therein on the signal wirings 550. The pixel electrode 548 formed from the second oxide conductive film 556 is formed on the passivation film 536 so as to be electrically connected to the signal wiring 550 via the through hole 542.

Using the first oxide conductive film 552, common electrodes 554 (see FIG. 18A) facing the pixel electrodes 548 are formed. As illustrated in FIGS. 24A and 24B, the gate insulating film 518 and the passivation film 536 have a notch (or passing through hole) 546 formed therein in communication therewith. Respective leading end surfaces of the gate wiring 516 and the first oxide conductive film 552 formed thereunder are flush with a plane of the notch (or passing through hole) 546.

In the above description, the structure is exemplified as being partially simplified for the sake of description. However, it is assumed that an actual structure of the display device to which the present invention is applied is more complicated.

Figure 25:
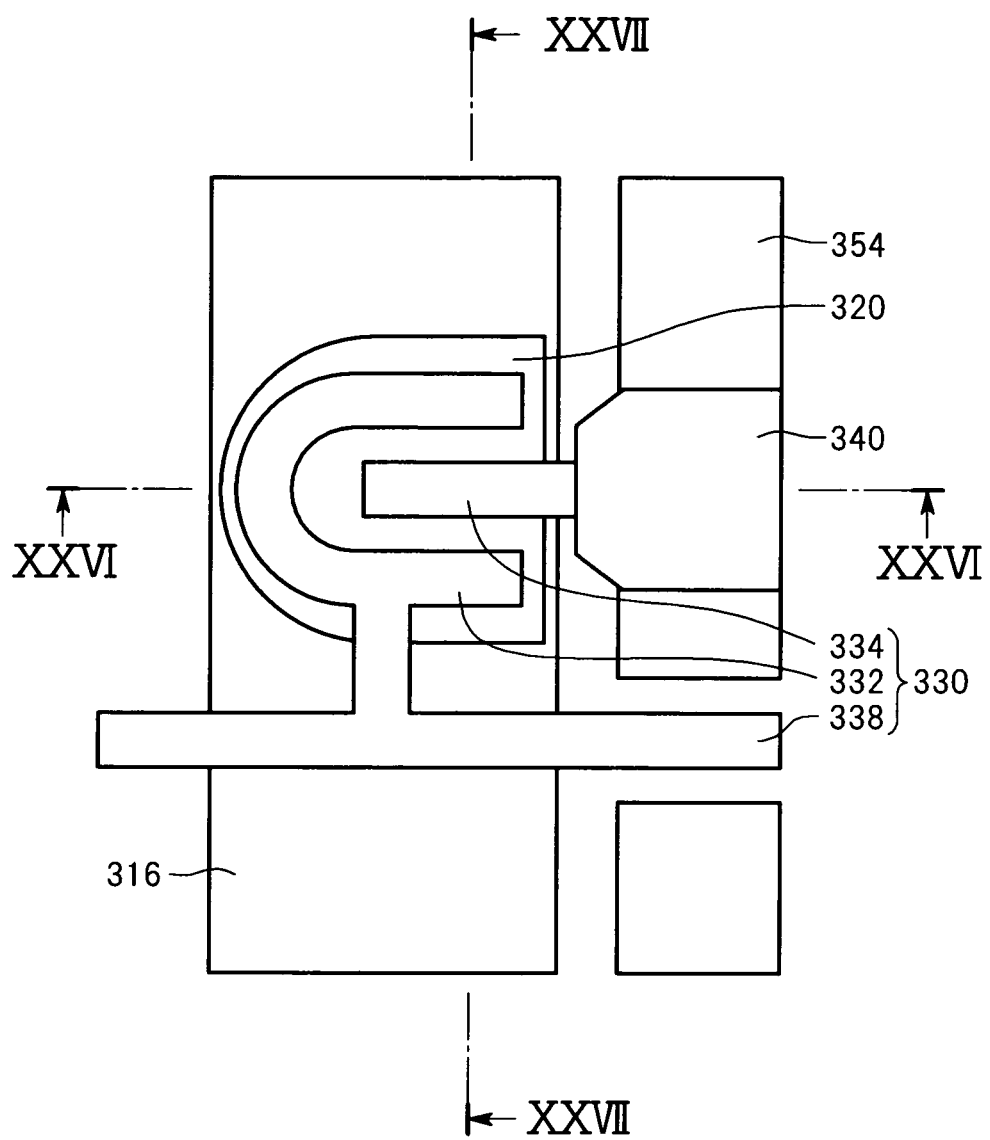
FIG. 25 is a partial plan view of the display device to which the present invention is applied.
Figure 26:
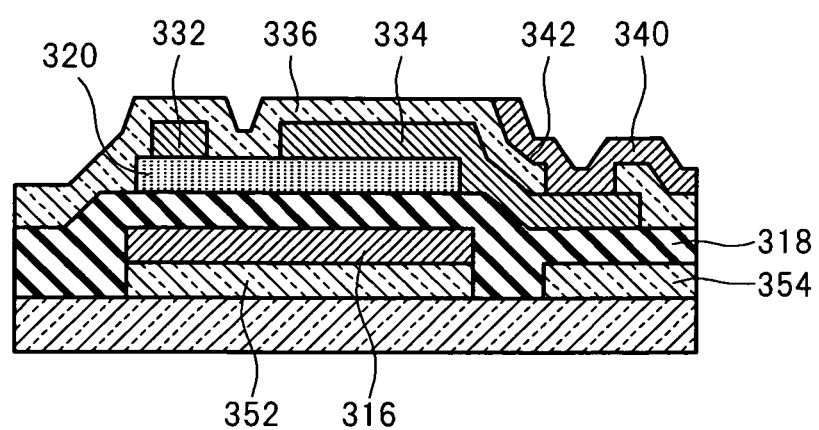
FIG. 26 is a cross-sectional view taken along the line XXVI-XXVI of the display device illustrated in FIG. 25.
Figure 27:
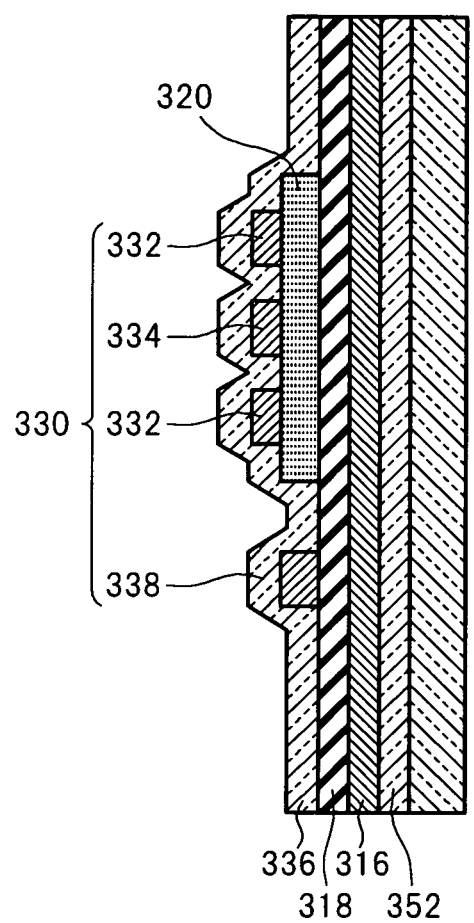
FIG. 27 is a cross-sectional view taken along the line XXVII-XXVII of the display device illustrated in FIG. 25.

FIG. 25 is a partial plan view of the display device to which the present invention is applied. FIG. 26 is a cross-sectional view taken along the line XXVI-XXVI of the display device illustrated in FIG. 25. FIG. 27 is a cross-sectional view taken along the line XXVII-XXVII of the display device illustrated in FIG. 25.

In this example, a wiring 330 is divided into a drain electrode 332 and a source electrode 334. The drain electrode 332 is U-shaped so that the linear source electrode 334 enters the U-shape. Although FIG. 25 illustrates one drain electrode 332, a plurality of the drain electrodes 332 are electrically connected by a wiring line 338.

Formed under the drain electrode 332 and the source electrode 334 is a semiconductor layer 320, formed under the semiconductor layer 320 is a gate insulating film 318, and formed under the gate insulating film 318 is a gate wiring 316. Formed under the gate wiring 316 is a first oxide conductive film 352. A common electrode 354 is formed of the same material in the same layer as those of the first oxide conductive film 352 (see FIG. 25).

The drain electrode 332 and the source electrode 334 are covered with a passivation film 336, and a pixel electrode 340 is formed on the passivation film 336. The pixel electrode 340 is electrically connected to the source electrode 334 via a through hole 342 formed in the passivation film 336.

Fourth Embodiment

FIG. 28 to FIG. 35 illustrate a manufacturing method for a display device according to a fourth embodiment of the present invention.

Figure 28:
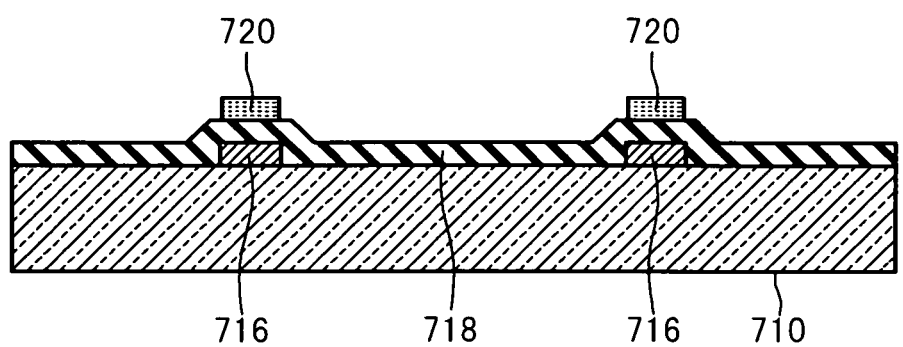
FIG. 28 illustrates a manufacturing method for a display device according to a fourth embodiment of the present invention.

In this embodiment, as illustrated in FIG. 28, a substrate 710 is prepared. The substrate 710 is made of glass, for example, and is often required to have optical transparency. The substrate 710 is a mother substrate for manufacturing a plurality of display devices integrally. One substrate 710 has a plurality of product areas (areas corresponding to display device components), and each of the product areas has an effective display area (image display area).

Taking a liquid crystal display panel as an example of the display device, the substrate 710 is a thin film transistor (TFT) substrate (or array substrate) including thin-film field-effect transistors, pixel electrodes, wirings, and the like. It should be noted that the liquid crystal display panel may employ any drive mode, such as an in-plane switching (IPS) mode, a twisted nematic (TN) mode, and a vertical alignment (VA) mode, and electrodes and wirings are formed according to the mode. Further, the display device according to the present invention is not limited to the liquid crystal display panel, and may be an electroluminescent display device.

On the substrate 710, gate wirings 716 are formed. The gate wirings 716 serve in part as gate electrodes of the field-effect transistors. In other words, this embodiment describes a bottom-gate field-effect transistor, whose gate electrode is located downward. Over the gate wirings 716, a gate insulating film 718, such as a silicon nitride film, is formed.

Above the substrate 710 (on the gate insulating film 718), a semiconductor layer 720, such as an amorphous silicon layer, is formed. The semiconductor layer 720 is patterned to have a source region, a drain region, and a channel region of each field-effect transistor. In the cross-section illustrated in FIG. 28, the semiconductor layer 720 is formed only above each gate wiring 716. The semiconductor layer 720 and the gate wirings 716 are electrically insulated from each other by the gate insulating film 718.

Figure 29:
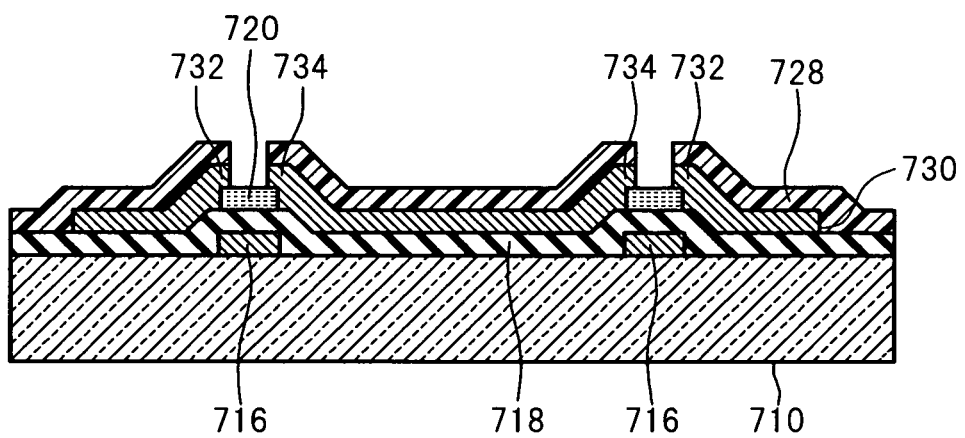
FIG. 29 illustrates the manufacturing method for a display device according to the fourth embodiment of the present invention.

As illustrated in FIG. 29, a wiring 730 is formed. The wiring 730 is patterned to be divided into source electrodes 732 and drain electrodes 734. The patterning is performed by etching through an etching resist 728. The etching resist 728 is formed by patterning a photoresist using photolithography. Then, an electrical test is conducted on the wiring 730. In conducting the electrical test, the wiring 730 extends continuously across the plurality of product areas, and adjacent drain electrodes 734 are electrically connected to each other, for example. Therefore, the electrical test on the plurality of product areas may be conducted at a time.

Figure 30:
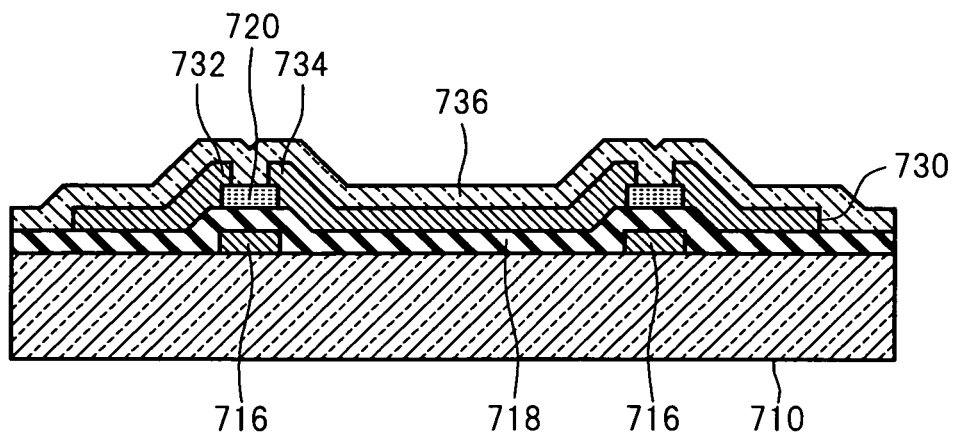
FIG. 30 illustrates the manufacturing method for a display device according to the fourth embodiment of the present invention.

As illustrated in FIG. 30, a passivation film 736 is formed over the patterned wiring 730. The passivation film 736 is formed of a semiconductor compound having insulating properties (such as $SiO_2$ or SiN).

Figure 31:
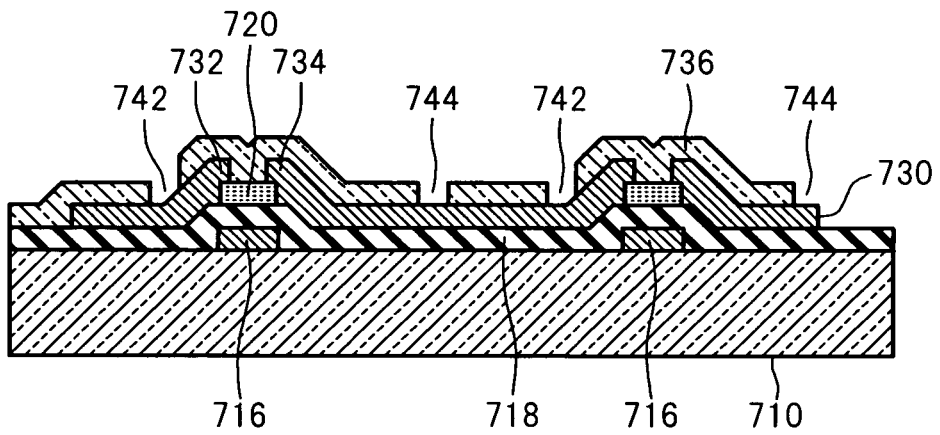
FIG. 31 illustrates the manufacturing method for a display device according to the fourth embodiment of the present invention.

As illustrated in FIG. 31, the passivation film 736 is etched to form through holes 742 in the passivation film 736, which are each used for establishing electrical connection to the wiring 730. The through hole 742 is formed on a part of the wiring 730. At the same time as the formation of the through hole 742, a passing through hole (or notch) 744 is formed in the passivation film 736 at a position of the wiring 730 closer to each cutting line of the substrate 710 with respect to the source electrode 732 and the drain electrode 734 (see FIG. 35), the passing through hole having a size containing a width of the wiring 730.

Figure 32:
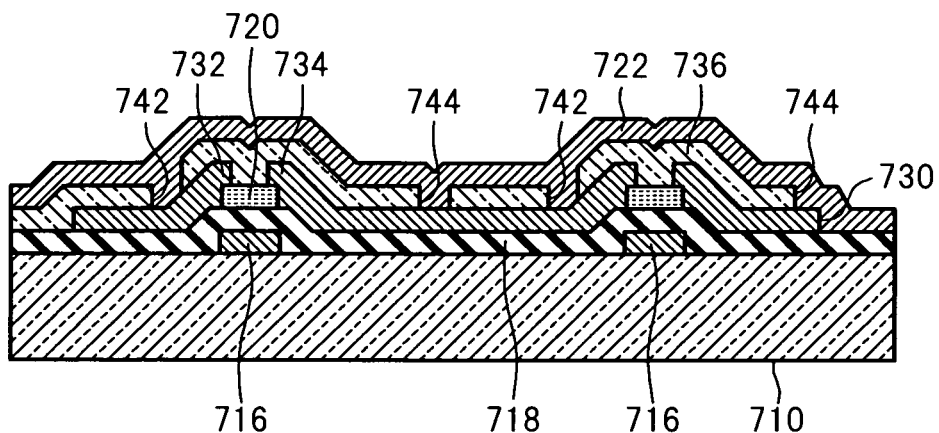
FIG. 32 illustrates the manufacturing method for a display device according to the fourth embodiment of the present invention.

As illustrated in FIG. 32, a metallic layer 722 is formed over the passivation film 736 and inside the through holes 742 on the wiring 730. At the same time, the metallic layer 722 is further formed inside the passing through holes (or notches) 744 on the wiring 730.

Figure 33:
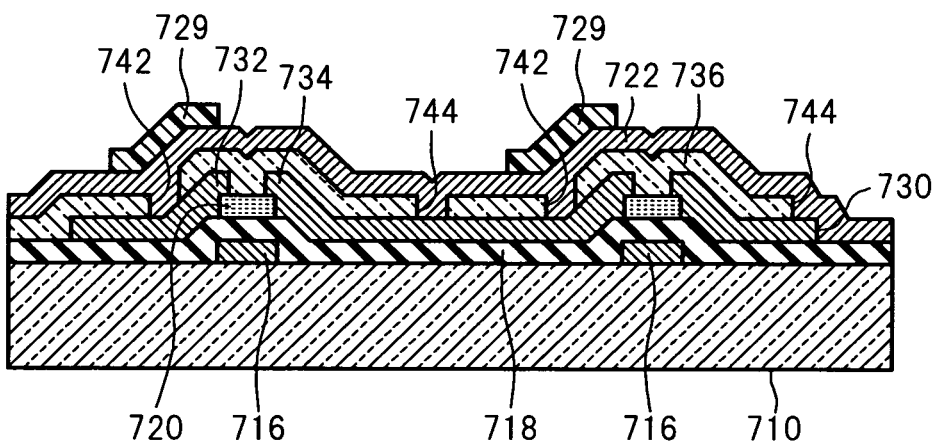
FIG. 33 illustrates the manufacturing method for a display device according to the fourth embodiment of the present invention.
Figure 34:
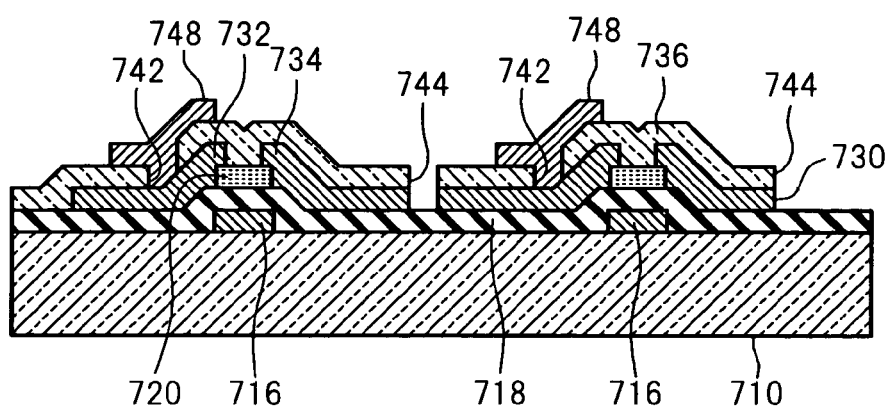
FIG. 34 illustrates the manufacturing method for a display device according to the fourth embodiment of the present invention.

As illustrated in FIG. 33, an etching resist 729 is formed in each region of the metallic layer 722 for forming a pixel electrode 748 (see FIG. 34).

As illustrated in FIG. 34, the metallic layer 722 is etched to form the pixel electrodes 748. It should be noted that FIG. 34 illustrates only a part of the pixel electrode 748. At the same time as the formation of the pixel electrode 748, the portion of the wiring 730 corresponding to the passing through hole (or notch) 744 is further etched to cut the wiring 730. According to this embodiment, the wiring 730 is cut at the same time as an originally-defined process, and hence an influence caused by exposed wirings 730 may be prevented without increasing the number of processes.

Figure 35:
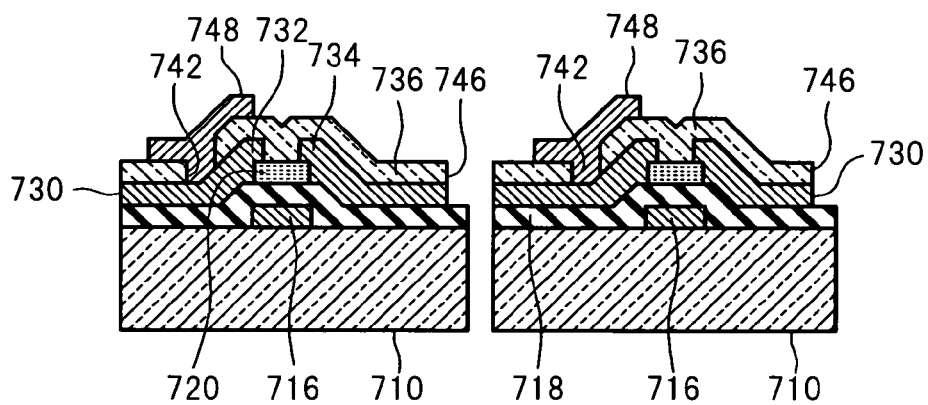
FIG. 35 illustrates the manufacturing method for a display device according to the fourth embodiment of the present invention.

As illustrated in FIG. 35, the substrate 710 is cut. At the same time as the cutting of the substrate 710, the passivation film 736 and the gate insulating film 718 are cut as well. In this way, individual TFT substrates are obtained, and a display device is obtained when a counter substrate (color filter substrate) (not shown) is disposed and then the substrate 710 and the counter substrate are cut.

The display device according to this embodiment includes the substrate 710, the semiconductor layer 720 formed above the substrate 710, and the wirings 730 formed in part on the semiconductor layer 720. The passivation film 736 covers the semiconductor layer 720 and the wirings 730, and has the through hole 742 formed therein at a position on the wiring 730. The passivation film 736 has the notch (or passing through hole) 746 formed therein. The pixel electrode 748 is formed on the passivation film 736 so as to be electrically connected to the wiring 730 via the through hole 742. A leading end surface of the wiring 730 is flush with a plane of the notch (or passing through hole) 746 of the passivation film 736. Other details of the display device according to the present invention encompass such a structure as is obvious from the above-mentioned manufacturing method.

In the above description, the structure is exemplified as being partially simplified for the sake of description. However, it is assumed that an actual structure of the display device to which the present invention is applied is more complicated.

Figure 36:
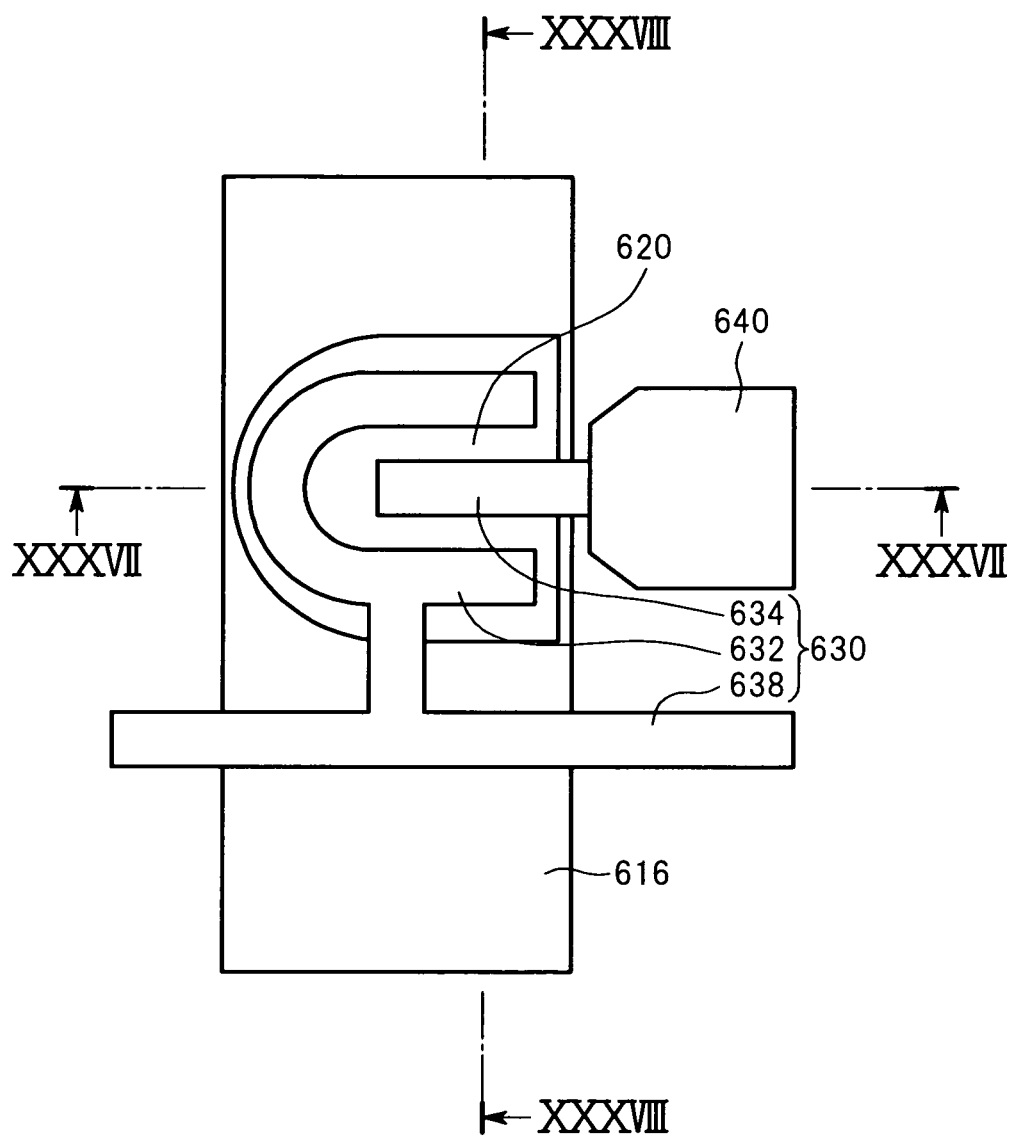
FIG. 36 is a partial plan view of the display device to which the present invention is applied.
Figure 37:
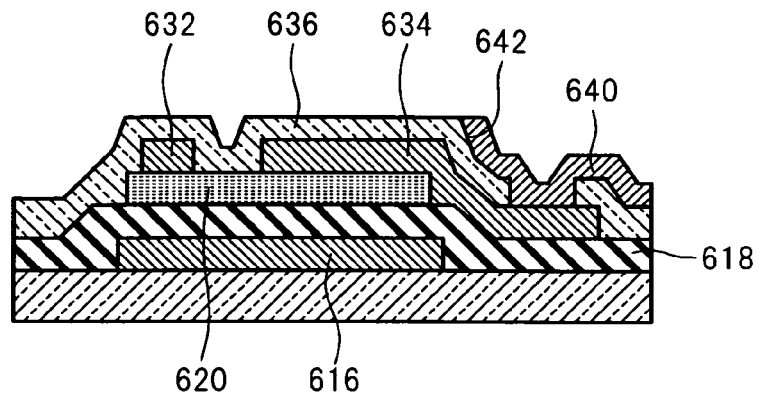
FIG. 37 is a cross-sectional view taken along the line 37-37 of the display device illustrated in FIG. 36.
Figure 38:
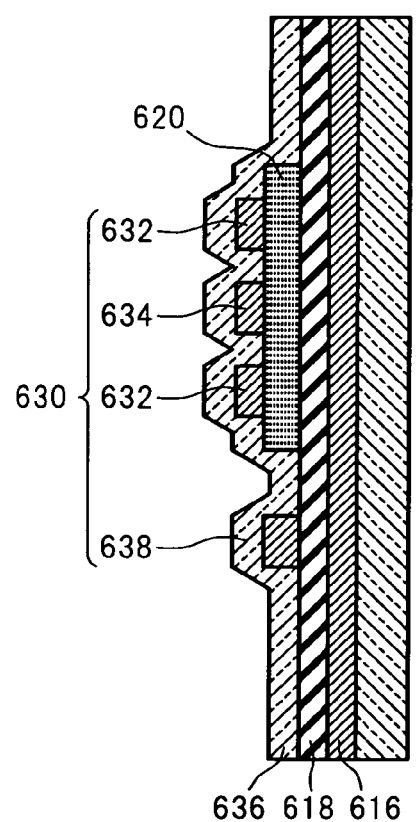
FIG. 38 is a cross-sectional view taken along the line 38-38 of the display device illustrated in FIG. 36.

FIG. 36 is a partial plan view of the display device to which the present invention is applied. FIG. 37 is a cross-sectional view taken along the line 37-37 of the display device illustrated in FIG. 36. FIG. 38 is a cross-sectional view taken along the line 38-38 of the display device illustrated in FIG. 36.

In this example, a wiring 630 is divided into a drain electrode 632 and a source electrode 634. The drain electrode 632 is U-shaped so that the linear source electrode 634 enters the U-shape. Although FIG. 36 illustrates one drain electrode 632, a plurality of the drain electrodes 632 are electrically connected by a wiring line 638. In an electrical test on the wiring 630, the wiring line 638 extends continuously across a plurality of product areas.

Formed under the drain electrode 632 and the source electrode 634 is a semiconductor layer 620, formed under the semiconductor layer 620 is a gate insulating film 618, and formed under the gate insulating film 618 is a gate wiring 616. The drain electrode 632 and the source electrode 634 are covered with a passivation film 636, and a pixel electrode 640 is formed on the passivation film 636. The pixel electrode 640 is electrically connected to the source electrode 634 via a through hole 642 formed in the passivation film 636.

Fifth Embodiment

FIG. 39 to FIG. 49 illustrate a manufacturing method for a display device according to a fifth embodiment of the present invention.

Figure 39:
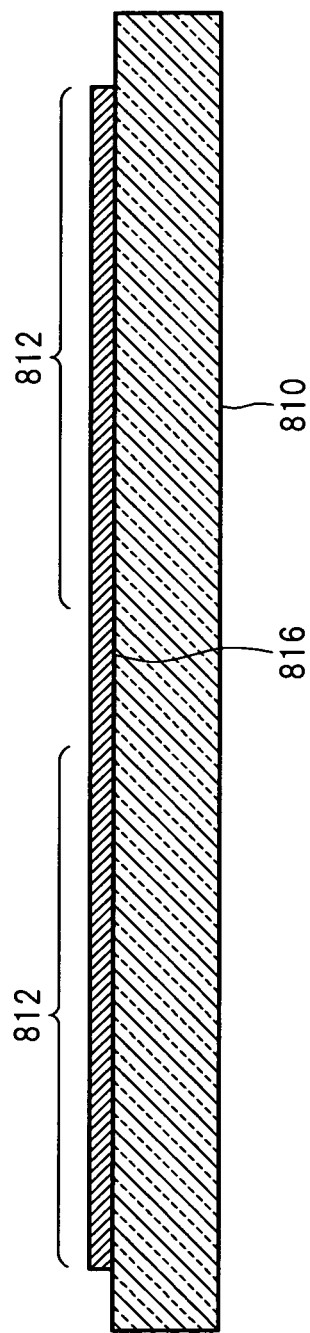
FIG. 39 illustrates a manufacturing method for a display device according to a fifth embodiment of the present invention.

As illustrated in FIG. 39, a gate wiring 816 is formed on a substrate 810. Then, an electrical test is conducted on the gate wiring 816. The gate wiring 816 extends continuously across a plurality of product areas 812. Therefore, the electrical test on the plurality of product areas 812 may be conducted at a time.

Figure 40:
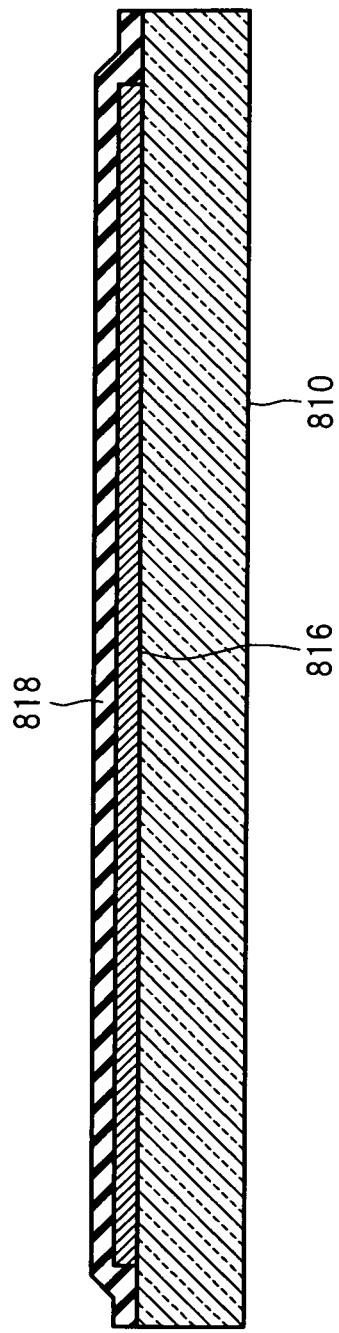
FIG. 40 illustrates the manufacturing method for a display device according to the fifth embodiment of the present invention.

As illustrated in FIG. 40, a gate insulating film 818 is formed over the gate wiring 816.

Figure 41:
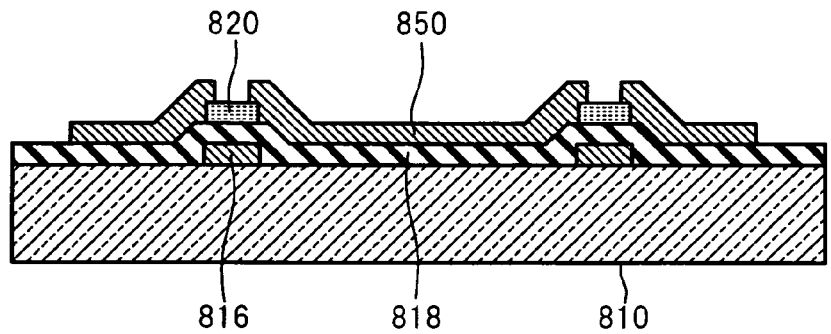
FIG. 41 illustrates the manufacturing method for a display device according to the fifth embodiment of the present invention.

As illustrated in FIG. 41, a patterned semiconductor layer 820 and a patterned signal wiring 850 formed on the semiconductor layer 820 are formed on the gate insulating film 818.

Figure 42:
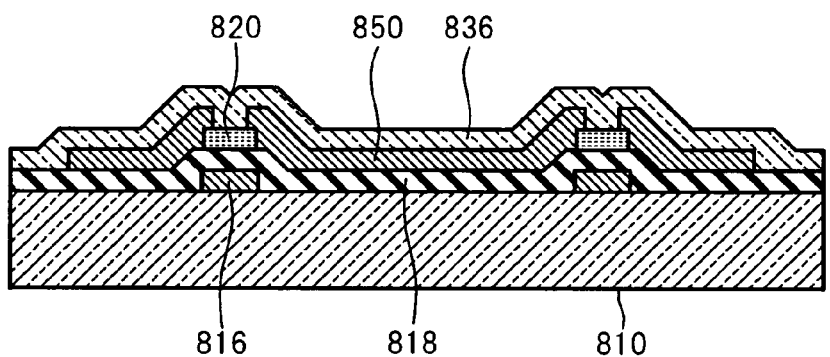
FIG. 42 illustrates the manufacturing method for a display device according to the fifth embodiment of the present invention.

As illustrated in FIG. 42, a passivation film 836 is formed over the signal wiring 850. The passivation film 836 is formed of a semiconductor compound having insulating properties (such as $SiO_2$ or SiN).

Figure 43:
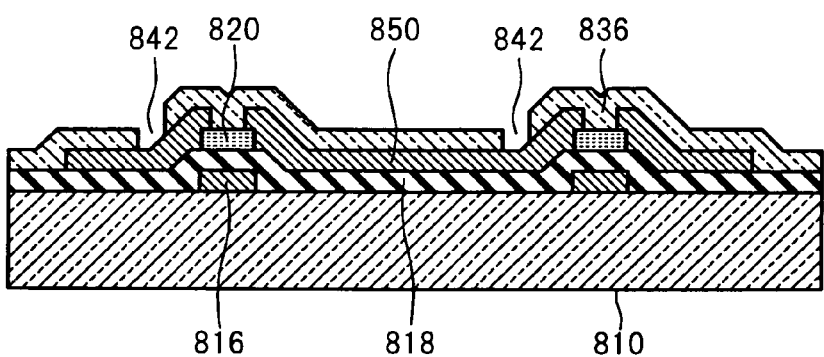
FIG. 43 illustrates the manufacturing method for a display device according to the fifth embodiment of the present invention.
Figure 44:
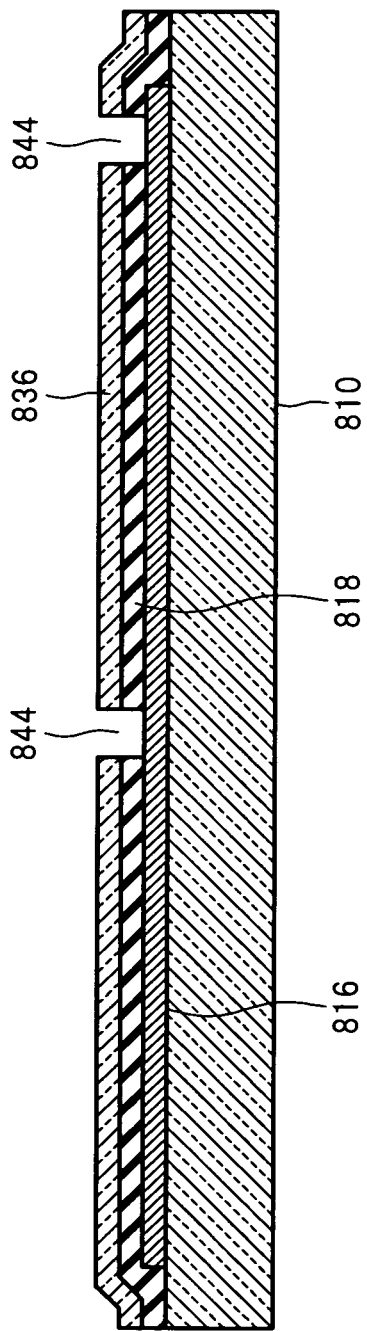
FIG. 44 illustrates the manufacturing method for a display device according to the fifth embodiment of the present invention.

As illustrated in FIG. 43, the passivation film 836 is etched to form through holes 842 in the passivation film 836, which are each used for establishing electrical connection to the signal wiring 850. At the same time, as illustrated in FIG. 44 (cross-sectional view taken along the line different from FIG. 43), a passing through hole (or notch) 844 is formed in communication with the passivation film 836 and the gate insulating film 818, at a position of the gate wiring 816 closer to each cutting line of the substrate 810 with respect to the semiconductor layer 820 (see FIG. 49), the passing through hole having a size containing a width of the gate wiring 816.

Figure 45:
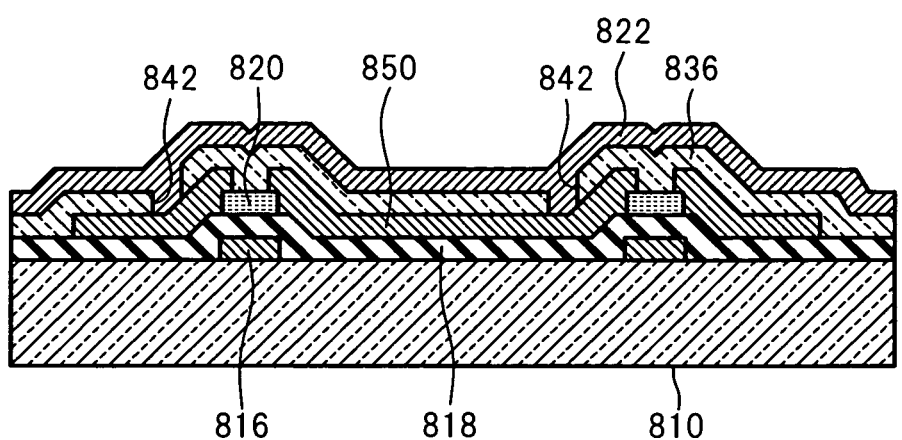
FIG. 45 illustrates the manufacturing method for a display device according to the fifth embodiment of the present invention.
Figure 46:
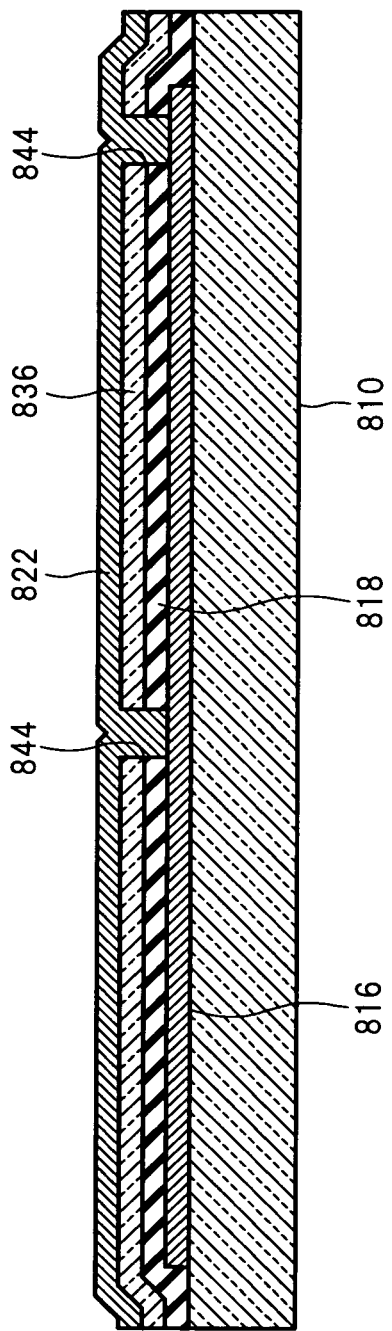
FIG. 46 illustrates the manufacturing method for a display device according to the fifth embodiment of the present invention.

As illustrated in FIG. 45, a metallic layer 822 is formed over the passivation film 836 and inside the through holes 842 on the signal wiring 850. At the same time, as illustrated in FIG. 46 (cross-sectional view taken along the line different from FIG. 45), the metallic layer 822 is further formed inside the passing through holes (or notches) 844 on the gate wiring 816.

Figure 47:
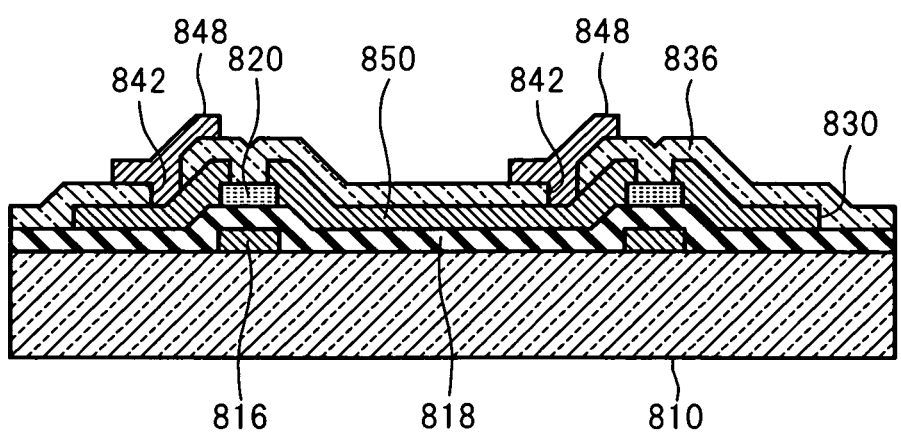
FIG. 47 illustrates the manufacturing method for a display device according to the fifth embodiment of the present invention.
Figure 48:
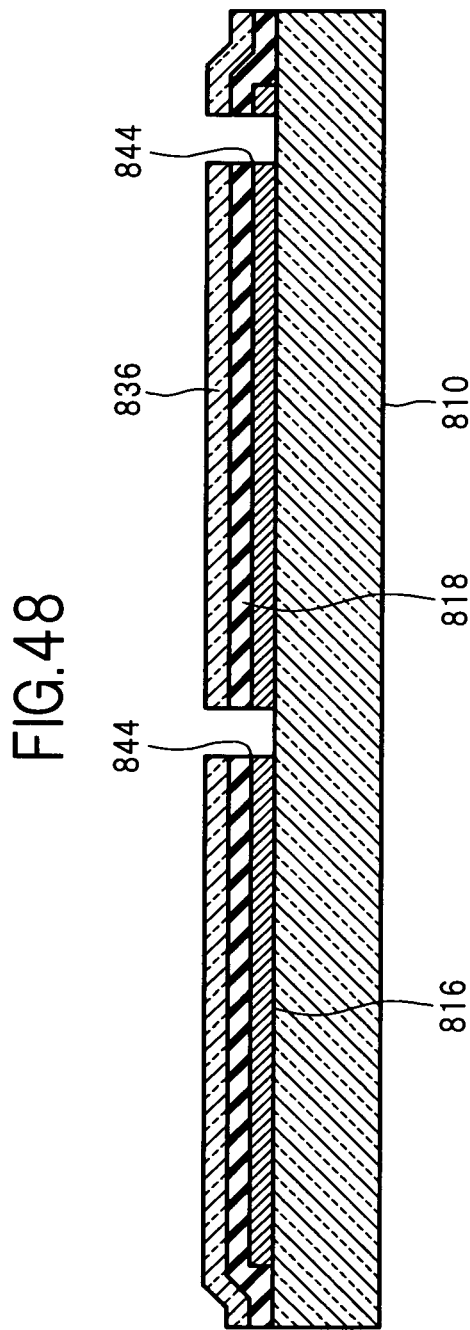
FIG. 48 illustrates the manufacturing method for a display device according to the fifth embodiment of the present invention.

As illustrated in FIG. 47, the metallic layer 822 is etched to form a pixel electrodes 848. At the same time, as illustrated in FIG. 48 (cross-sectional view taking along the line different from FIG. 47), a portion of the gate wiring 816 corresponding to the passing through hole (or notch) 844 is further etched to cut the gate wiring 816. According to this embodiment, the gate wiring 816 is cut at the same time as an originally-defined process, and hence an influence caused by exposed gate wirings 816 may be prevented without increasing the number of processes.

Figure 49:
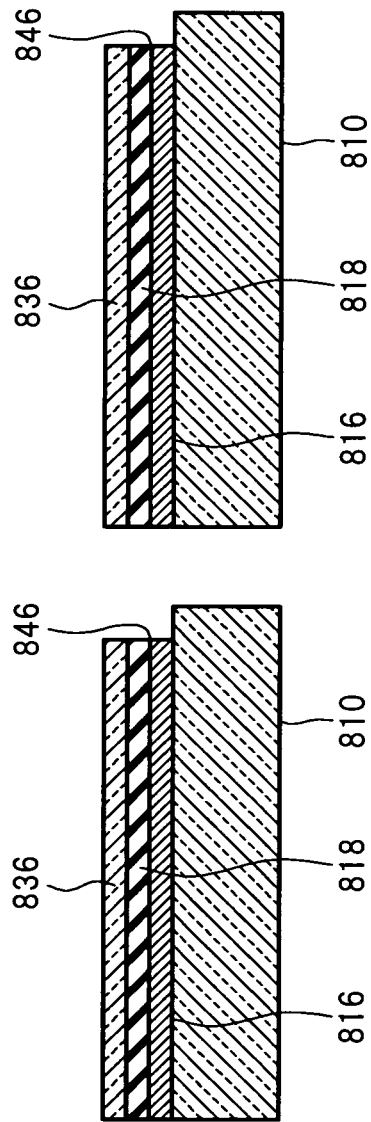
FIG. 49 illustrates the manufacturing method for a display device according to the fifth embodiment of the present invention.

After the formation of the pixel electrode 848, as illustrated in FIG. 49, the substrate 810 is cut. In this way, individual TFT substrates are obtained, and a display device is obtained when a counter substrate (color filter substrate) (not shown) is disposed and then the substrate 810 and the counter substrate are cut. Other details of this embodiment correspond to the contents described in the fourth embodiment.

The display device according to this embodiment includes the substrate 810, the gate wirings 816, the gate insulating film 818 covering the gate wirings 816, the semiconductor layer 820 formed on the gate insulating film 818, and the signal wirings 850 formed in part on the semiconductor layer 820 (see FIG. 47). The passivation film 836 covers the semiconductor layer 820 and the signal wirings 850, and has the through holes 842 formed therein at the positions on the signal wirings 850. The pixel electrode 848 is formed on the passivation film 836 so as to be electrically connected to the signal wiring 850 via the through hole 842. The gate insulating film 818 and the passivation film 836 have a notch (or passing through hole) 846 formed therein in communication therewith (see FIG. 49). A leading end surface of the gate wiring 816 is flush with a plane of the notch (or passing through hole) 846. Other details of the display device according to this embodiment encompass such a structure as is obvious from the above-mentioned manufacturing method.

The present invention is not limited to the embodiments described above, and various modifications may be made thereto. For example, the structures described in the embodiments may be replaced by a structure having substantially the same structure, a structure having the same action and effect, and a structure which may achieve the same object.

What is claimed is:

1. A manufacturing method for a display device, comprising:
   (a) forming a semiconductor layer above a substrate;
   (b) forming a metallic layer on the semiconductor layer;
   (c) forming, on the metallic layer, an etching resist comprising a first portion and a second portion, the first portion being thicker than the second portion;
   (d) etching and patterning the semiconductor layer and the metallic layer through the etching resist so as to form a wiring from the metallic layer and leave the semiconductor layer under the wiring;
   (e) conducting an electrical test on the wiring;
   (f) thinning the etching resist to remove the second portion while leaving the first portion unremoved;
   (g) performing selective etching through the first portion, which is left unremoved, so as to leave the semiconductor layer unetched, to thereby pattern the wiring to be divided into a drain electrode and a source electrode; and
   (h) cutting the substrate,
   wherein the step (g) of patterning the wiring comprises etching the wiring to be cut at a position closer to a cutting line of the substrate with respect to the drain electrode and the source electrode, while leaving the semiconductor layer unetched.

2. The manufacturing method for a display device according to claim 1, further comprising:
   (i) forming a passivation film over the wiring before the step (h) cutting the substrate and after the step (g) of patterning the wiring; and
   (j) etching the passivation film to form a through hole in the passivation film, which is used for establishing electrical connection to the wiring,
   wherein the step (j) of etching the passivation film comprises etching the passivation film and the semiconductor layer so that one of a passing through hole and a notch is formed in the passivation film at the position closer to the cutting line of the substrate with respect to the drain electrode and the source electrode, and that the semiconductor layer is cut, which is left unetched after the wiring is cut.

3. The manufacturing method for a display device according to claim 2, wherein the passivation film comprises one of an $SiO_2$ film and an SiN film.

4. A display device, comprising:
   a substrate;
   a semiconductor layer formed above the substrate;
   a wiring formed in part on the semiconductor layer; and
   a passivation film covering an upper surface of each of the semiconductor layer and the wiring,
   wherein the semiconductor layer comprises a first portion and a second portion, the first portion being located under the wiring, the second portion protruding from the wiring from the first portion along a longitudinal direction of the wiring,
   wherein the passivation film comprises one of a passing through hole and a notch formed therein, and
   wherein the second portion of the semiconductor layer has a leading end side surface, which is flush with a plane of the one of the passing through hole and the notch extending perpendicular to the substrate.

5. The display device according to claim 4, wherein the passivation film comprises one of an $SiO_2$ film and an SiN film.

* * * * *